(12) United States Patent
Tsujiuchi et al.

(10) Patent No.: US 7,511,342 B2
(45) Date of Patent: Mar. 31, 2009

(54) SEMICONDUCTOR DEVICE HAVING SOI STRUCTURE AND METHOD FOR MANUFACTURING THE SAME

(75) Inventors: Mikio Tsujiuchi, Tokyo (JP); Toshiaki Iwamatsu, Tokyo (JP); Shigeto Maegawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 186 days.

(21) Appl. No.: 11/341,444

(22) Filed: Jan. 30, 2006

(65) Prior Publication Data

US 2006/0180861 A1 Aug. 17, 2006

(30) Foreign Application Priority Data

| Feb. 14, 2005 | (JP) | ............................. 2005-035985 |
| Dec. 26, 2005 | (JP) | ............................. 2005-372223 |

(51) Int. Cl.
*H01L 31/0392* (2006.01)

(52) U.S. Cl. .............................. 257/347; 257/E27.112; 438/149

(58) Field of Classification Search ................. 257/213, 257/288, 347, E27.112; 438/142, 149, 151, 438/157
See application file for complete search history.

(56) References Cited

U.S. PATENT DOCUMENTS

2002/0048972 A1 * 4/2002 Yamaguchi et al. .......... 438/926

| 2002/0090764 A1 | 7/2002 | Maeda et al. |
| 2004/0150047 A1 | 8/2004 | Maeda et al. |

FOREIGN PATENT DOCUMENTS

| JP | 2000-243973 | 9/2000 |
| JP | 2002-208705 | 7/2002 |

\* cited by examiner

*Primary Examiner*—Evan Pert
*Assistant Examiner*—Kevin Quinto
(74) *Attorney, Agent, or Firm*—Oblon, Spivak, McClelland, Maier & Neustadt, P.C.

(57) ABSTRACT

In a semiconductor device, a gate electrode, an impurity diffused region, a body potential fixing region, a first insulator, and a dummy gate electrode are provided on top of an SOI substrate consisting of an underlying silicon substrate, a buried insulator, and a semiconductor layer. The impurity diffused region is a region formed by implanting an impurity of a first conductivity type into the semiconductor layer around the gate electrode. The body potential fixing region is a region provided in the direction of an extension line of the length of the gate electrode and implanted with an impurity of a second conductivity type. The first insulator is formed at least in the portion between the body potential fixing region and the gate electrode. The dummy gate electrode is provided on the first insulator between the body potential fixing region and the gate electrode.

10 Claims, 37 Drawing Sheets

SEMICONDUCTOR DEVICE HAVING SOI STRUCTURE AND METHOD FOR MANUFACTURING THE SAME

BACKGROUND OF THE INVENTION

1. Field of the Invention

The present invention relates to a semiconductor device and a method for manufacturing a semiconductor device and, in particular, to a semiconductor device having an SOI structure and a method for manufacturing the same.

2. Background Art

The SOI (Silicon On Insulator) substrate of transistors having an SOI structure consists of a multilayered stack of an underlying silicon substrate, a buried insulator, and an SOI layer. A gate electrode is formed on top of a gate insulator on the SOI substrate. The SOI layer is separated into active areas by a partial isolation insulator. The partial isolation insulator is formed by filling a trench in the SOI layer with an insulator such as an oxide. The trench is formed down to a depth such that it does not completely penetrate through the SOI layer. The portion of SOI layer left under the partial isolation insulator acts as a well.

A portion of the SOI layer under the gate electrode is a channel region. Impurity diffused layers (extension and source/drain) are formed on both sides of the channel region. A body potential fixing region for fixing a body potential is provided on the opposite side of the partial isolation insulator from the channel region. The channel region and the body potential fixing regions are electrically interconnected through the well.

For forming the body potential fixing region and the impurity diffused regions on both sides of the gate electrode, ions of opposite types are implanted respectively. During the ion implantation of the source/drain, therefore, the body potential fixing region is masked with a resist; during the ion implantation of the body potential fixing region, the impurity diffused layer is masked with a resist.

The gate electrode is separated from the body potential fixing region by the partial isolation insulator. When ion implantation is performed, typically a resist mask is not provided on the partial isolation insulator. During such ion implantation, ions are also implanted into the partial isolation insulator.

In SOI semiconductor devices, the partial isolation insulator is very thin. Accordingly, when ions are implanted into the partial isolation insulator without a mask, some of the ions may penetrate through the partial isolation insulator into the well under it. If ions are implanted into the well, the resistance of the well, from the body potential fixing region to the channel region, may increase and thus isolation characteristics can degrade.

To prevent this problem, an approach has been proposed in which a resist mask used during source/drain implantation is provided so as to cover the partial isolation insulator between the gate electrode and the body potential fixing region as well as the body potential fixing region, and the ion implantation is performed with the resist mask to prevent undesired impurity from penetrating into the well (for example see Japanese Patent Laid-Open No. 2002-208705).

Especially during ion implantation of the impurity diffused layers (extension and source/drain), ions must be precisely implanted in proper positions on both sides of the gate electrode. Therefore, when a resist mask is provided on the partial isolation insulator as stated above, the resist mask must be precisely aligned with the gate electrode. However, precise alignment of the resist is difficult to achieve. If the resist mask cannot precisely be formed and unnecessarily overlaps the gate electrode, sufficient ions cannot be implanted in proper positions.

SUMMARY OF THE INVENTION

Therefore, the present invention provides an improved semiconductor device and a method for manufacturing the same which enable ion implantation for forming an impurity diffused layer while preventing ions from penetrating through a partial isolation insulator even if it is thin.

According to one aspect of the present invention, a semiconductor device comprises a substrate including an underlying silicon substrate, a buried insulator, and a semiconductor layer. A first gate electrode is formed on a gate insulator on the semiconductor layer. A first impurity diffused region is formed in a region around the first gate electrode in the direction of the length of the first gate electrode in the semiconductor layer by implanting with an impurity of a first conductivity type. A second impurity diffused region is formed in a region in the semiconductor layer in the direction of an extension line of the length of the first gate electrode by implanting with an impurity of a second conductivity type opposite the first conductivity type. A first insulator is formed at least on a region of the semiconductor layer between the second impurity diffused region and the first gate electrode. A second gate electrode formed on the first insulator between the second impurity diffused region and the first gate electrode.

According to another aspect of the present invention, in a method for manufacturing a semiconductor device, a first insulator is formed so as to separate a semiconductor layer of a silicon-on-insulator substrate including an underlying substrate, a buried insulator formed on top of the underlying substrate and a semiconductor layer formed on top of the buried insulator, into a first and a second regions. A gate insulator is formed on the semiconductor layer. A first gate electrode is formed on the first region and a second gate electrode is formed on the first insulator. A first resist mask is formed so as to cover the second region. An impurity of a first conductivity type is implanted into the first region by using the first resist mask and the first and second gate electrodes as a mask and then, the first resist mask is removed. A second resist mask is formed so as to cover the first region. A second impurity of a second conductivity type is implanted into the semiconductor layer by using the second resist mask and then, the second resist mask is removed Other and further objects, features and advantages of the invention will appear more fully from the following description.

DETAILED DESCRIPTION OF THE PREFERRED EMBODIMENTS

Figure 1A:
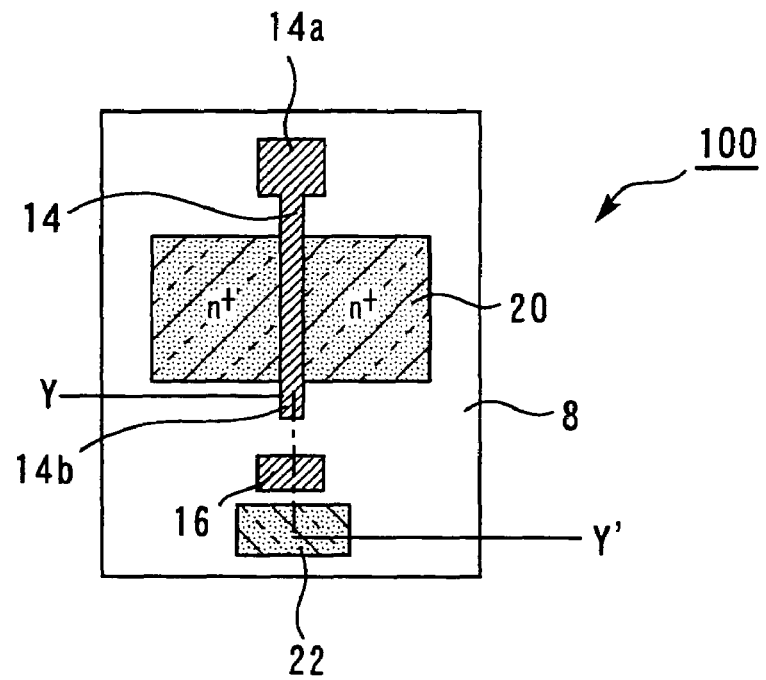
FIGS. 1A and 1B are schematic cross-sectional views illustrating a semiconductor device according to a first embodiment of the present invention.

Embodiments of the present invention will be descried with reference to the accompanying drawings. Through the drawings, like or equivalent elements are labeled like reference numerals and the description thereof will be simplified or omitted.

While specific numerical quantities such as numbers, quantities, amounts, and ranges of elements are referred to in the following description of embodiments, the present invention is not limited to the specific numerical quantities unless otherwise stated or unless clearly apparent from principle. Also, structures and steps of methods described with respect to the embodiments are not essential to the present invention unless otherwise stated or clearly apparent from principle.

Figure 1B:
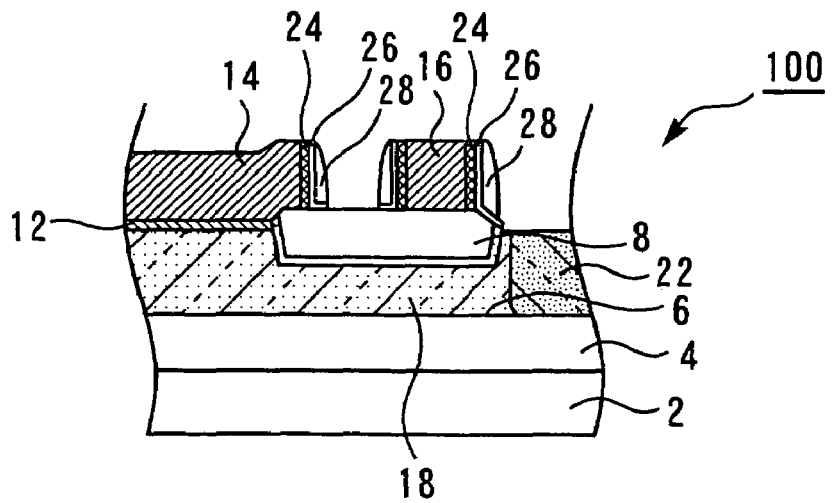
Figure 2:
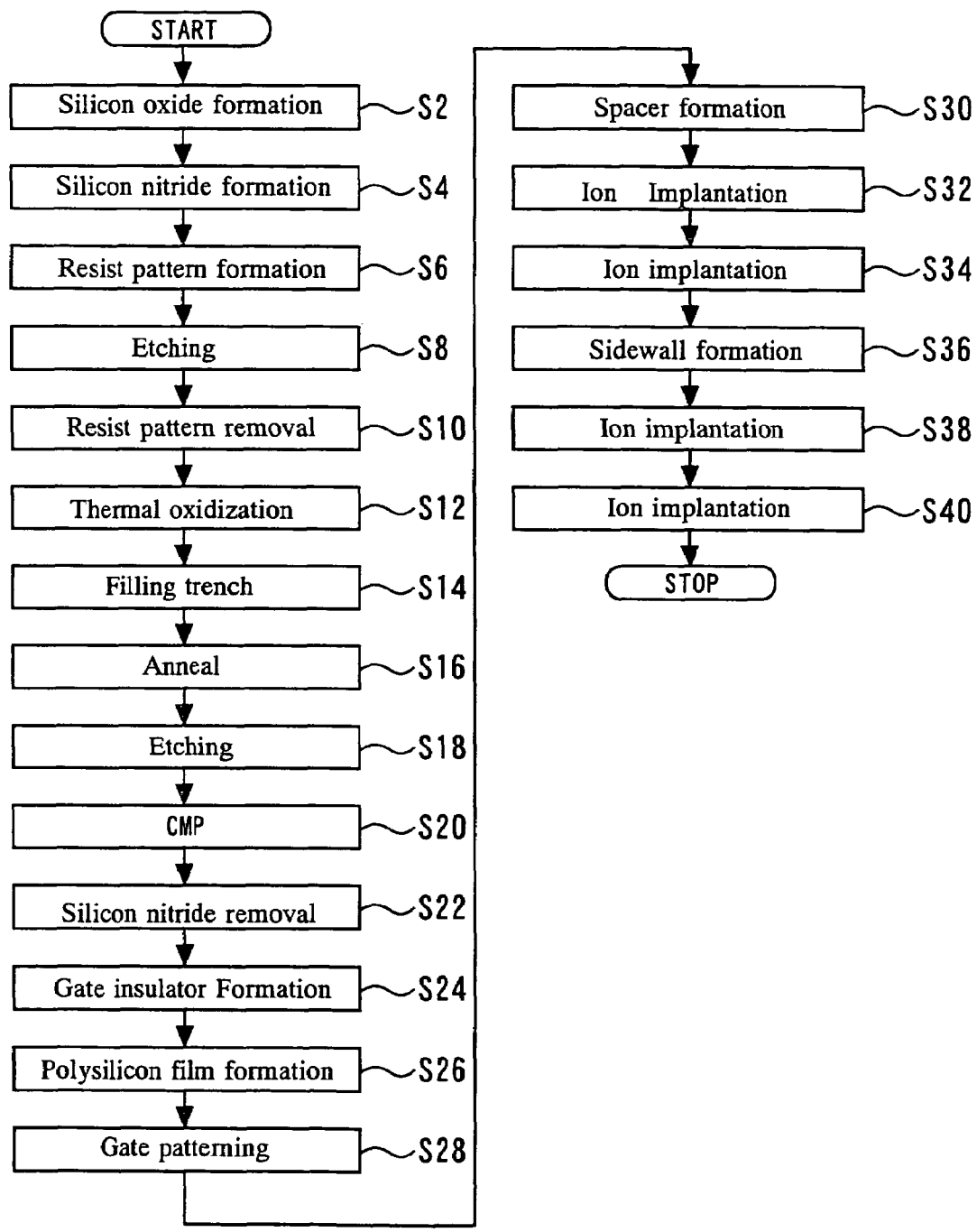
FIG. 2 is a flowchart illustrating a method for manufacturing a semiconductor device according to the first embodiment of the present invention.

Part "A" of each of FIGS. 1 to 23, excluding FIG. 2, illustrates a top view, in which spacers and sidewalls on the sides of electrode are not depicted for simplicity unless specifically described. Also, in the following description, the vertical direction in part "A" of each figure will be referred to as the Y-direction and the horizontal direction will be referred to as the X-direction for convenience.

First Embodiment

FIGS. 1A and 1B are schematic cross-sectional views illustrating a semiconductor device according to a first embodiment of the present invention. FIG. 1A is a top view of the semiconductor device and FIG. 1B illustrates a cross-sectional view taken on line Y-Y' of FIG. 1A.

As shown in FIGS. 1A and 1B, the substrate of the semiconductor device is an SOI (Silicon on Insulation) substrate having a multilayered structure including an underlying silicon substrate 2, a buried insulator 4 (buried insulator film), and an SOI layer 6 (semiconductor layer). The term "SOI layer" as used herein refers to the top semiconductor layer of the SOI substrate.

A partial isolation insulator 8 (first isolator) is formed in the SOI layer 6 and separates the SOI layer into active areas. The partial isolation insulator 8 is formed down to a depth such that a certain thickness of the SOI layer 6 is left under it.

A gate electrode 14 (first gate electrode) is formed on a gate insulator 12 on the SOI layer 6. However, the ends 14a, 14b of the longitudinal direction (i.e. in the Y-direction) of the gate electrode 14 are formed on the partial isolation insulator 8, where the gate insulator film 12 is not formed between the gate electrode 14 and the SOI layer 6. A dummy gate electrode 16 (second gate electrode) is formed at a position on an extension line in the longitudinal direction (i.e. in the Y-direction) of the gate electrode 14 on the partial isolation insulator 8, that is, at a position opposed to end 14b of the gate electrode. The term "dummy gate electrode" as used hereinafter refers to an electrode that is not connected to an actual wiring or, if connected, does not function as a gate electrode in the semiconductor device.

In the Y-Y' cross-section shown in FIG. 1B, the portion of the SOI layer 6 under the partial isolation insulator 8 is a well 18. The well 18 is a p-well, for example, if the adjacent transistor shown is an nMOS transistor. impurity diffused layers (extension and source/drain) 20 (first impurity diffused region) are formed on both sides of the gate electrode 14 of the surface of the SOI layer 6. The impurity diffused layers 20 are regions doped with an n-type impurity, for example, if the transistor is an nMOS transistor. A body potential fixing region 22 (second impurity diffused region) is formed on the opposite side on the SOI layer 6 of the partial isolation insulator 8 from the gate electrode 14. The body potential fixing region 22 is a region doped with an impurity of the type opposite that of the impurity diffused layers 20 (that is, the same type as that of the channel region under the gate electrode 14). For example, if the transistor is an nMOS transistor, the body potential fixing region 22 is an area doped with a p-type impurity. This means that the channel region in the SOI layer 6 under the gate electrode 14 is electrically connected with the body potential fixing region 22 through the well 18. The potential of the body potential fixing region 22 can be fixed from an external source.

Formed on the sides of the gate electrode 14 and the dummy gate electrode 16 are spacers 24 made of a silicon oxide. Formed on the side of each spacer 24 is a silicon oxide film 26 and a silicon nitride film 28 as a sidewall. The distance between the dummy gate electrode 16 and the body potential fixing region 22 is equal to the combined width of the spacer 24 and the sidewall (26, 28). In other words, the space between the dummy gate electrode 16 and the body potential fixing region 22 is filled with the spacer 24 and the sidewall (26, 28).

In the semiconductor device 100 configured as described above, the potential of the SOI substrate of the transistor can be fixed from an external source through an external connection line connected to the body potential fixing region 22 through a body contact (not shown), by way of the body potential fixing region 22 and the well 18.

The dummy gate electrode 16 is formed on the partial isolation insulator 8 between end 14a of the gate electrode 14 and the body potential fixing region 22 in the semiconductor device 100. The dummy gate electrode 16 functions as a mask for the partial isolation insulator 8 during ion implantation for forming the impurity diffused layers 20. Accordingly, the amount of ions implanted into the partial isolation insulator 8 is minimized and therefore the amount of ions penetrating into the well 18 through the partial isolation insulator 8 is also minimized.

FIG. 2 is a flowchart illustrating a method for manufacturing a semiconductor device 100 according to the first embodiment of the present invention. FIGS. 3A to 11B are schematic diagrams illustrating states in a process of manufacturing the semiconductor device 100. Part "A" of each of FIGS. 3 to 11 shows a top view corresponding to the one in FIG. 1A and part "B" depicts a cross-section corresponding to the one in FIG. 1B(b).

While the method according to the first embodiment is also applied when a CMOS or pMOS is formed, the following description will focus on a case where an nMOS transistor is formed and the figures mainly depict the nMOS transistor, for simplicity.

Figure 3A:
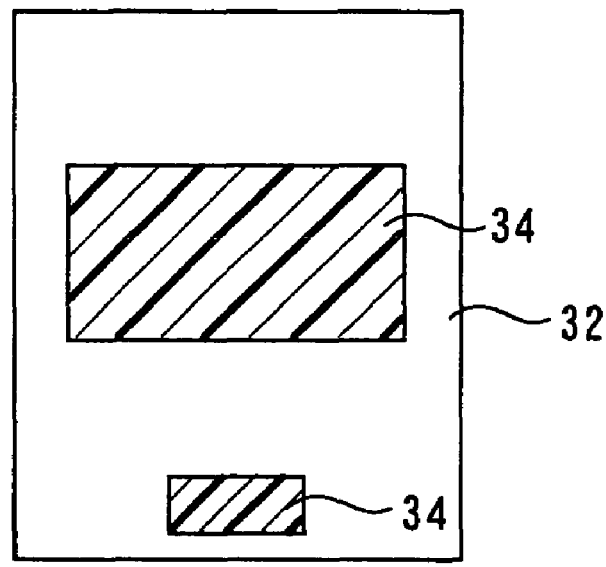
FIGS. 3A to 11B are schematic diagrams illustrating states in a process of manufacturing the semiconductor device according to the first embodiment of the present invention.
Figure 3B:
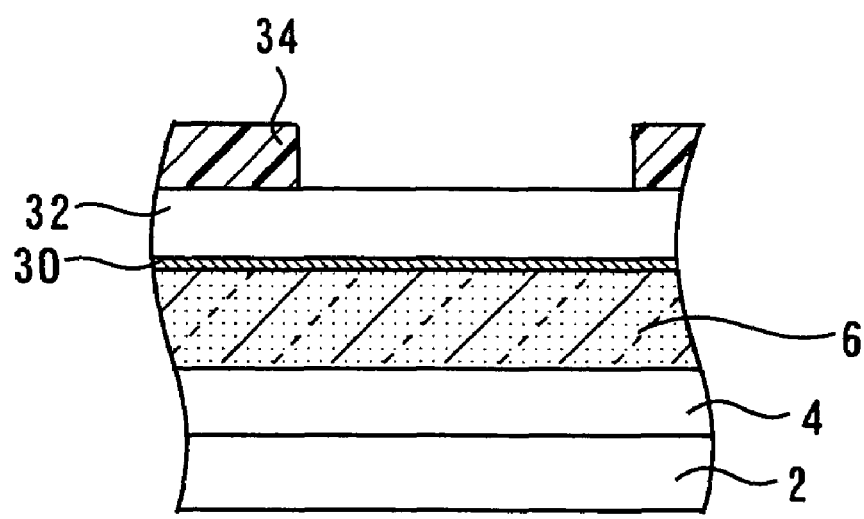

First, a silicon oxide film 30 and a silicon nitride film 32 are formed on an SOI substrate consisting of a underlying silicon substrate 2, a buried insulator 4, and an SOI layer 6 which has a thickness of 30 to 200 nm or so (steps S2 and S4). Then, a resist pattern 34 for forming a trench is formed by photolithography as shown in FIGS. 3A and 3B (step S6). The resist pattern 34 has an opening over a portion where the partial isolation insulator 8 will be formed.

Figure 4A:
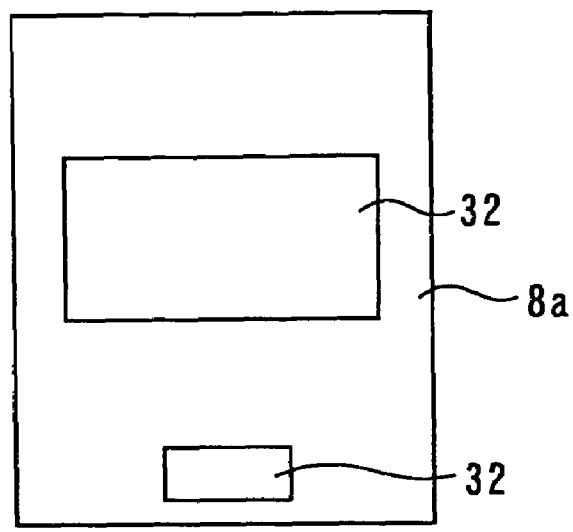
Figure 4B:
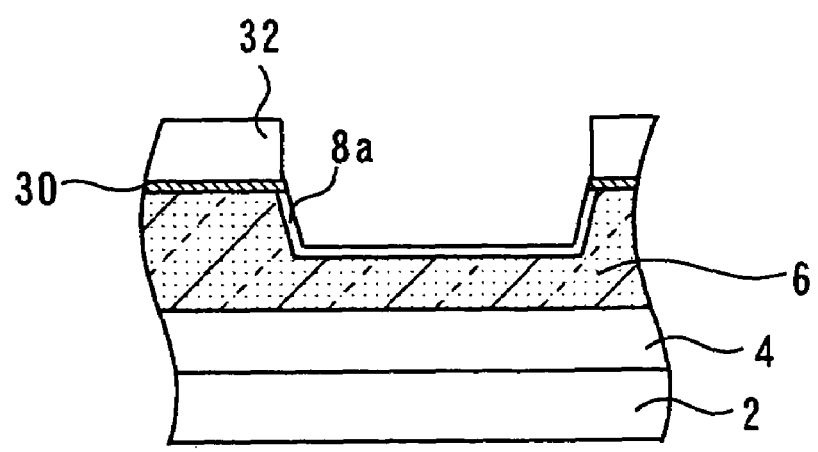
Figure 5A:
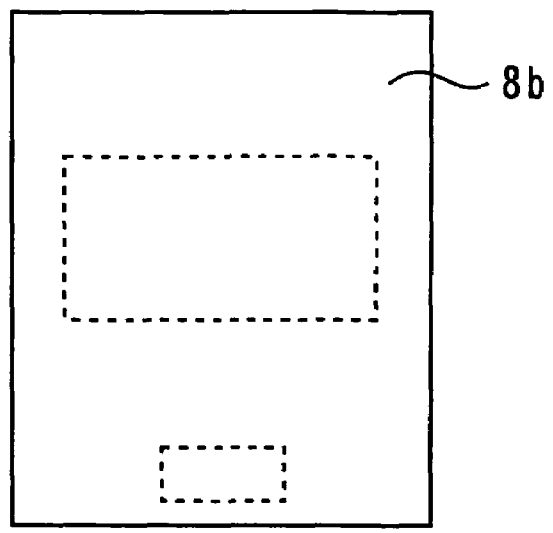
Figure 5B:
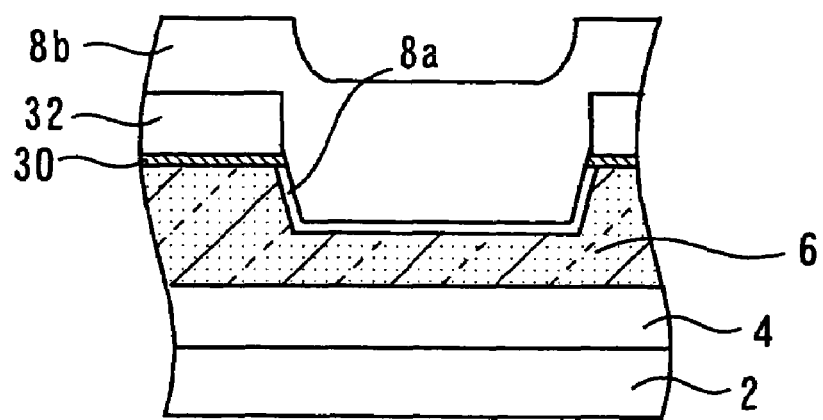

Then, the silicon nitride film 32 and the silicon oxide film 30 are etched by using the resist pattern 34 as a mask to form a trench with a predetermined depth in the SOI layer 6 (step S8). The trench is formed in such a manner that a certain thickness of the SOI layer 6 is left under the trench. Then, the resist pattern 34 is removed (step S10) and thermal oxidization is performed (step S12). As a result, a silicon oxide film 8a is formed on the inner wall of the trench in the portion where the SOI layer 6 is exposed, as shown in FIGS. 4A and 4B. Then, at least the trench is filled with a silicon oxide film 8b as shown in FIGS. 5A and 5B (step S14) and annealing is performed (step S16).

It should be noted that the trench is directly filled with the silicon oxide film without forming the silicon oxide film 8a by thermal oxidation. Annealing is not necessary after the filling with the silicon oxide film 8b.

Figure 6A:
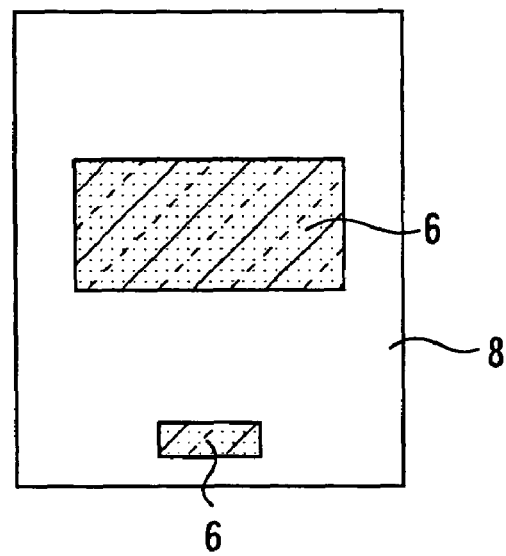
Figure 6B:
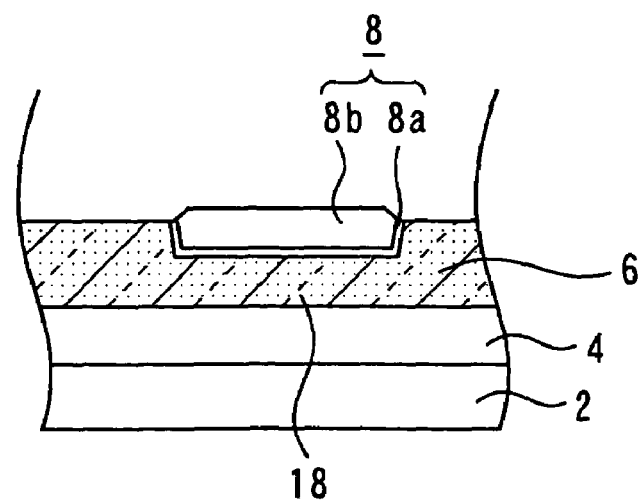

Then, a resist film is applied to the entire surface to form a resist pattern for etching and then etching is performed (step S18), and the surface is then planarized by CMP (Chemical Mechanical Polishing) (step S20). Then, the silicon nitride film 32 left on the surface is removed (step S22). As a result, the trench is filled with the silicon oxide films 8a and 8b to form a partial isolation insulator 8 as shown in FIGS. 6A and 6B.

Then, a gate insulator film 12 is formed by thermal oxidation (step S24) and a polysilicon film for providing a gate electrode 14 and a dummy gate electrode 16 is formed (step S26).

The polysilicon film is then patterned (step S28) in such a manner that minimum distance of the design rule between the gate electrode 14 and the dummy gate electrode 16 is provided and that the distance between the body potential fixing region 22 and the dummy gate electrode 16 becomes equal to the combined width of a spacer 24 and sidewall.

Figure 7A:
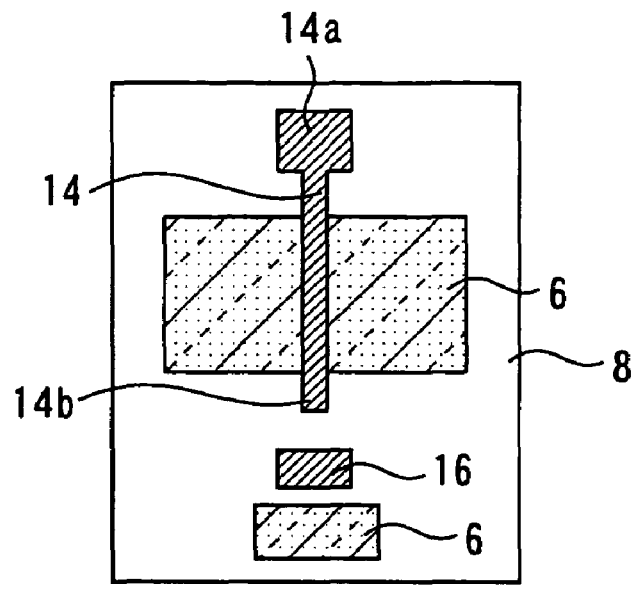
Figure 7B:
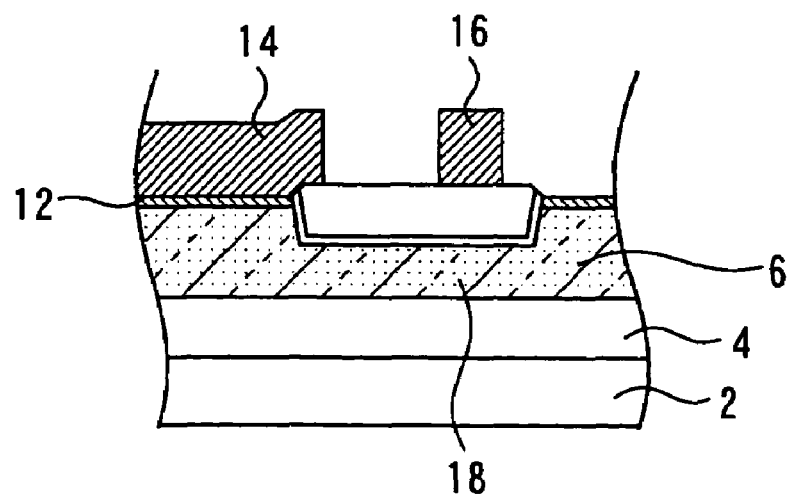

More specifically, in the patterning of the polysilicon film, a resist pattern is first formed by photolithography and then the polysilicon film is etched by using the resist pattern as a mask. As a result, the gate electrode 14 and the dummy gate electrode 16 with desired shapes are formed as shown in FIGS. 7A and 7B.

Figure 8A:
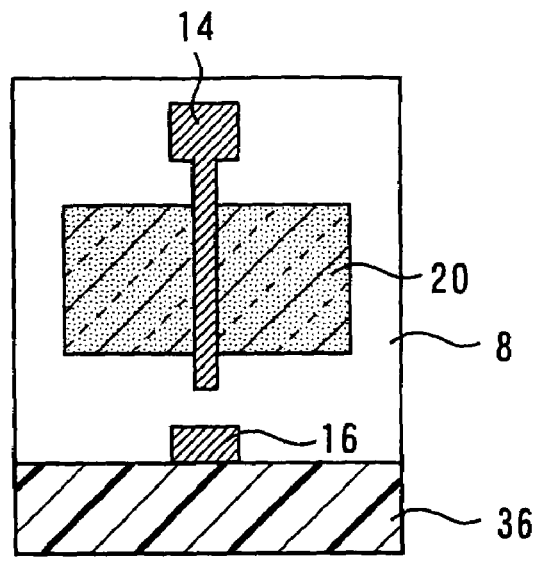
Figure 8B:
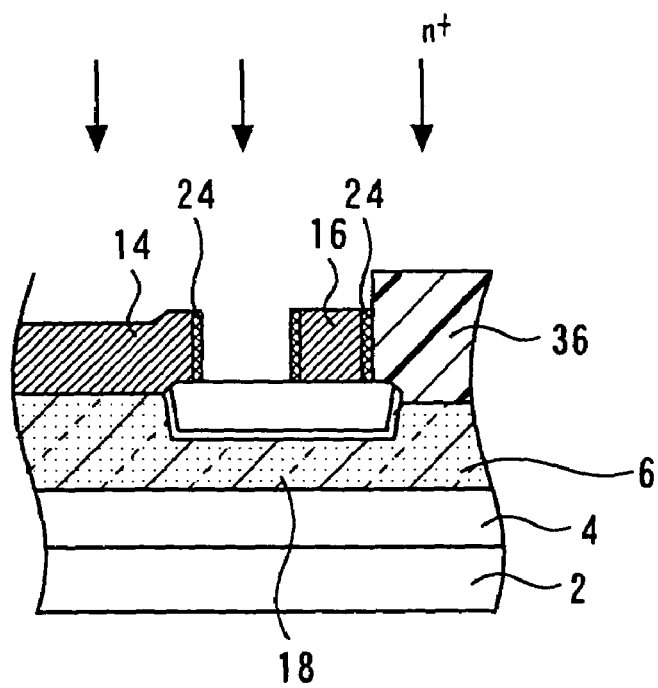

Then, spacers 24 are formed on the sides of the gate electrode 14 and the dummy gate electrode 16 as shown in FIGS. 8A and 8B (step S30). The spacers 24 may be formed by for example evenly depositing an oxide film on the gate electrode 14 and the dummy gate electrode 16 and then performing anisotropic etching.

Then ion implantation for forming an extension in impurity diffused layers 20 is performed (step S32). Before ion implantation for forming the extension, a resist mask 36 is formed first so that it covers the body potential fixing region 22, and then ion implantation for forming the extension is performed. In particular, if an nMOS is to be formed, n-type ions are implanted. The resist mask 36, the gate electrode 14, the dummy gate electrode 16 function as a mask during the ion implantation. Thus, n-type ions are implanted into the SOI layer 6 on both sides of the gate electrode 14 to form an extension. The gate electrode 14 is prevented from being damaged by the ion implantation because the sides of the gate electrode 14 are protected by the spacers 24.

Also, the dummy gate electrode 16 formed on the partial isolation insulator 8 acts as a mask during the ion implantation. Accordingly, the amount of ions implanted into the partial isolation insulator 8 above the well 18 can be minimized and therefore the amount of ions penetrating into the well 18 can be minimized. Furthermore, ions do not penetrate into the body potential fixing region 22 because it is covered with the resist mask 36.

Then, p-type ions are implanted to form a pocket (not shown) surrounding the bottom of the extension. As with the case of the extension implantation, the gate electrode 14, the dummy gate electrode 16, and the resist mast 36 function as a mask during in this implantation. The resist mask 36 is removed after the ion implantation for forming the pocket.

Figure 9A:
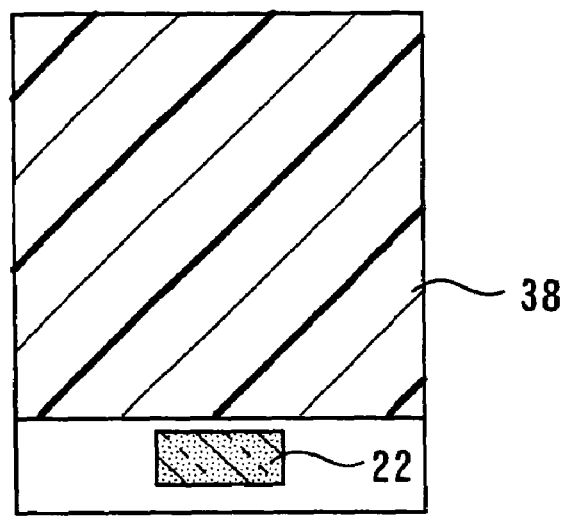
Figure 9B:
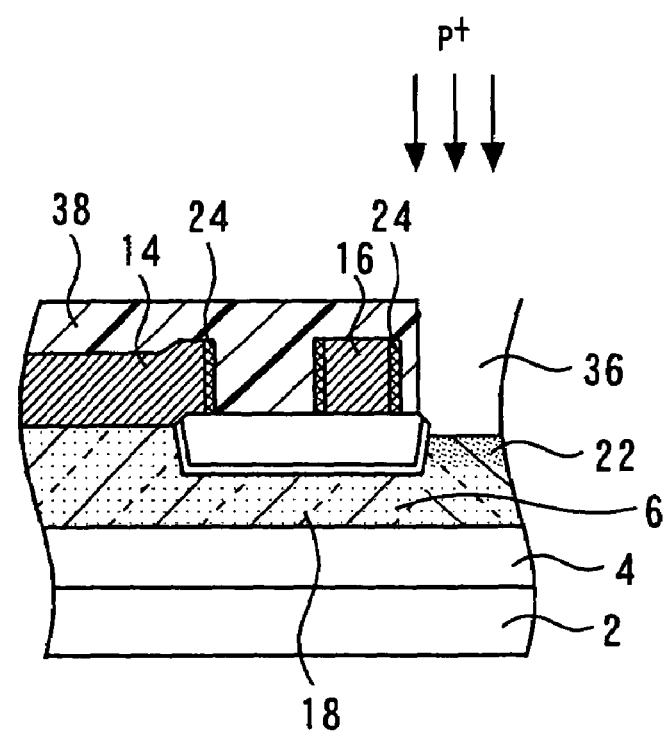

Then, ions are implanted into the body potential fixing region 22 (step S34). Before the ion implantation, a resist mask 38 is formed to cover the area where the nMOS transistor is to be formed, as shown in FIGS. 9A and 9B. Then, p-type ions are implanted into the body potential fixing region 22 using the resist mask 38 as a mask. If a pMOS transistor is to be formed in a location not shown, an extension similar to that of the nMOS is formed on both sides of the gate electrode of the pMOS transistor. In that case, n-type ions are implanted, as required, to form a pocket surrounding the extension. The resist mask 38 is then removed.

Figure 10A:
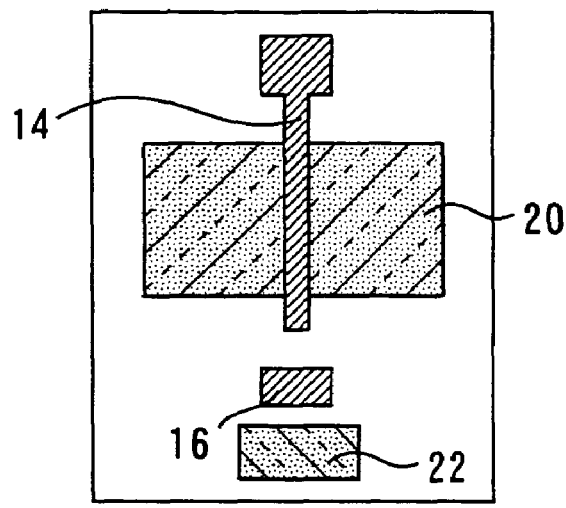
Figure 10B:
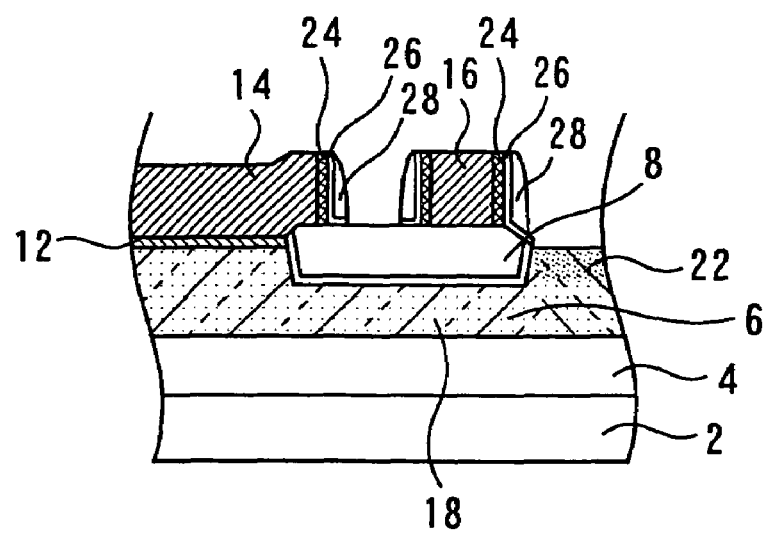

Then, sidewalls are formed as shown in FIGS. 10A and 10B (step S36). In particular, first a silicon oxide film 26 and a silicon nitride film 28 are deposited in this order. Then, etch-back is performed so that the silicon oxide film 26 and the silicon nitride film 28 are left only on the sides of the gate electrode 14 and the dummy gate electrode 16. As a result, sidewalls are formed. The etch-back is performed in such a manner that the thickest portion of the combination of the spacer 24 and the sidewall (26, 28) (namely the width of the bottom portion of the sidewall in FIG. 10B) becomes equal to the distance between the body potential fixing region 22 and the dummy gate electrode 16. In other words, the etch-back is performed so that the surface between the dummy gate electrode 16 and the body potential fixing region 22 is filled with the spacers 24 and the sidewalls (26, 28).

Figure 11A:
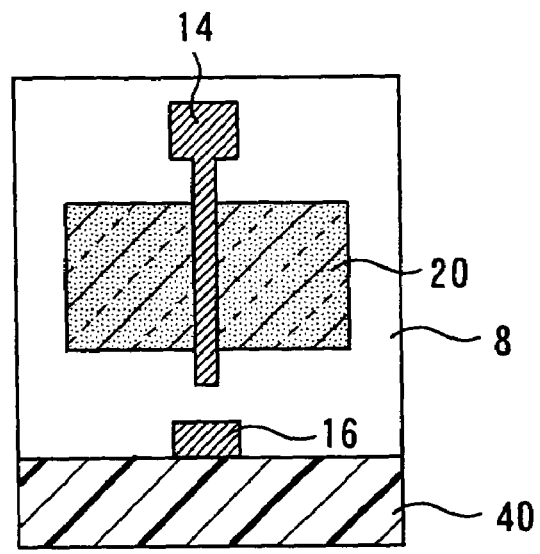
Figure 11B:
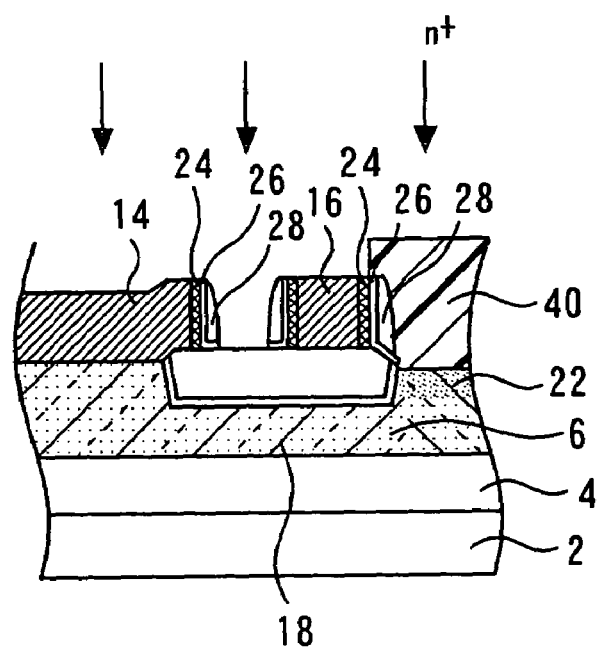

Then, ion implantation for forming the source/drain in the impurity diffused layers 20 of the nMOS transistor is performed (step S38). As with the formation of the extension, a resist mask 40 that covers the body potential fixing region 22 is formed as shown in FIGS. 11A and 11B. The space between the body potential fixing region 22 and the dummy gate electrode 16 is filled with the spacer 24 and the sidewall (26, 28). This means that the spacer 24 and the sidewall (26, 28) functions as a mask for the space between the dummy gate electrode 16 and the body potential fixing region 22 during ion implantation. Accordingly, the alignment of the resist mask 40 does not need to be highly precise; the resist mask 40 maybe formed to cover at least the body potential fixing region 22.

N-type ion implantation is performed using the resist mask 40, the gate electrode 14, the dummy gate electrode 16, and their spacers 24 and sidewalls 26, 28 on the side as a mask. As a result, implantation of the source/drain having a deep junction and a relatively high impurity concentration is completed in the SOI layer 6 on the both sides of the gate electrode 14 and a impurity diffused layers 20 are formed in the SOI layer 6 around the gate electrode 14. The ions are implanted with high energy and concentration. However, the amount of ions implanted through the partial isolation insulator 8 into the well 18 under it is sufficiently small because the partial isolation insulator 8 is covered to some extent by the dummy gate electrode 16. The resist mask 40 is removed after the ion implantation.

Then, ions are implanted into the body potential fixing region 22 (step S40). As with the ion implantation in the nMOS transistor at step S34, a resist mask is first formed that covers regions into which p-type ions are not to be implanted. Then p-type ions are implanted by using the resist mask and the dummy gate electrode 16 and the spacer 24 and sidewall 26, 28 formed on the sides of the dummy gate electrode 16 as a mask. With this, p-type ions are heavily implanted into the body potential fixing region 22, completing the body potential fixing region 22. At the same time, the source/drain of the pMOS transistor, not shown, are formed. Then, the resist mask is removed. Thermal treating for activation is performed as needed.

After the process described above, an insulator film is formed to cover the elements such as the gate electrodes formed on the substrate and then planarized by CMP. In particular, an insulator film is formed with the dummy gate electrode 16 left formed on the substrate, in addition to the gate electrode 14, to cover them and then CMP is performed. Thus, planarization can be performed on a uniformly flat surface of the insulator.

Then, contact plugs connecting to the impurity diffused layers 20 and the body potential fixing regions 22 are formed. By forming a required layer such as a multilevel interconnection layer is further formed on the insulator film to complete the semiconductor device.

As has been described, according to the first embodiment, the dummy gate electrode 16 formed on the partial isolation insulator 8 functions as a mask during the ion implantation for forming the impurity diffused layers 20. This can inhibit ions from penetrating into the partial isolation insulator 8 and consequently inhibit penetrating through the partial isolation insulator 8 into the well 18 under it. Therefore, degradation of isolation characteristics of the well 18 connecting the channel region and the body potential fixing region 22 can be inhibited to provide a semiconductor device with good device characteristics.

Specifically, consider the resistance between the channel region and the body potential fixing region 22. For example, if the resistance of the semiconductor layer under end 14b of the gate electrode is 100Ω/sheet for each of the 2 sheets, that is, 200Ω in total, and the resistance of the well 18 under the partial isolation insulator 8 is 1,000Ω/sheet, that is, 1,000Ω in total, in a semiconductor device in which a dummy gate electrode 16 is not formed, then the resistance of the whole semiconductor device will be 1,200Ω. It is important to note that the sheet resistance of the well 18 under the partial isolation insulator 8 is high because ions have penetrated into the well 18.

In contrast, in the semiconductor device having a similar structure but with a dummy gate electrode 16 formed thereon so as to cover the partial isolation insulator 8, the sheet resistance of the portion covered with the dummy gate electrode 16 is the same as the sheet resistance of the SOI layer 6 under the end 14b of the gate electrode, that is, 100Ω/sheet. The sheet resistance of a region of the partial isolation insulator 8 on which the dummy gate electrode 16 is not formed maybe, for example, 1,000Ω/sheet because ions have been penetrated in this portion. However, the area of this portion is smaller than that in the conventional semiconductor device, for example 0.5 sheet. Thus, the resistance of the portion under the end 14b of the gate electrode is 200Ω, the resistance of the portion under the partial isolation insulator 8 in which ion has been penetrated is 500Ω, the resistance of the portion under the partial isolation insulator 8 on which the dummy gate electrode 16 is formed is approximately 100Ω. Therefore, the resistance of the whole semiconductor device is approximately 800Ω.

Thus, the resistance between the body potential fixing region 22 and the channel region can be minimized by forming the dummy gate electrode 16.

Figure 12A:
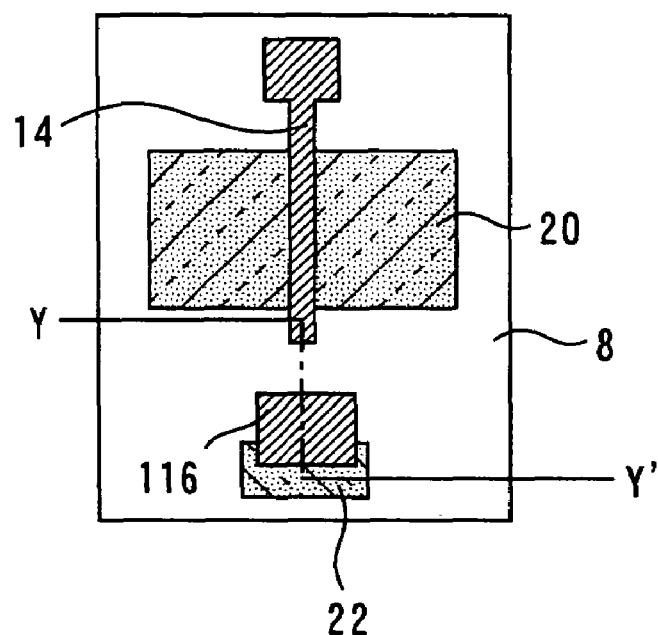
FIGS. 12A and 12B are schematic diagrams illustrating another exemplary semiconductor device according to the first embodiment of the present invention.
Figure 12B:
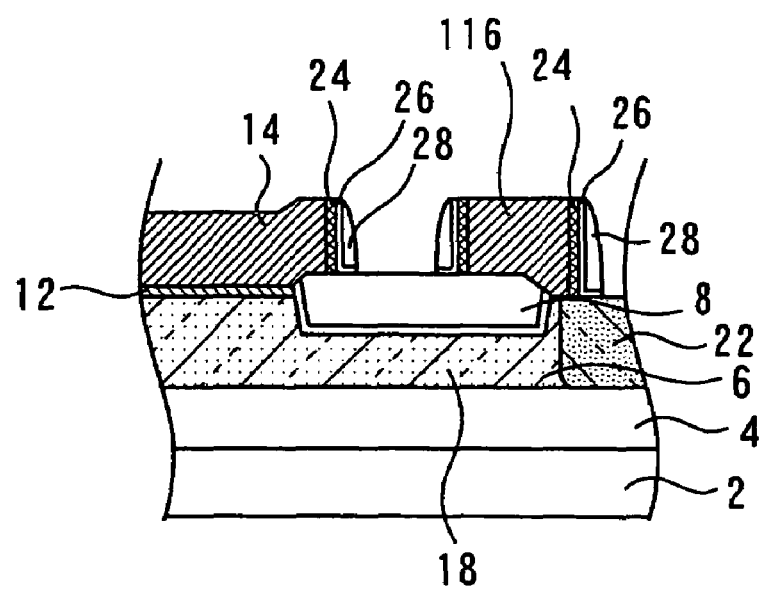

FIGS. 12A and 12B are a schematic diagrams illustrating another exemplary semiconductor device according to the first embodiment of the present invention. FIG. 12A illustrates a top view of the semiconductor device and FIG. 12B illustrates a cross-section taken on line Y-Y' of FIG. 12A.

The semiconductor device shown in FIGS. 12A and 12B is the same as the semiconductor device 100 shown in FIGS. 1A and 1B, except that a dummy gate electrode 116 overlaps a portion of the body potential fixing region 22.

In the semiconductor device shown in FIGS. 12A and 12B, the SOI layer 6 is not exposed in the space between the body potential fixing region 22 and the dummy gate electrode 116. This arrangement eliminates the need for an precise alignment of a resist mask with the dummy gate electrode 116 when the resist mask covering the body potential fixing region 22 is formed before implantation of impurity diffused layers (extension and source/drain) 20 of the transistor. Furthermore, in the event of a misalignment of the resist mask formed, the dummy gate electrode 116 can effectively inhibit penetration of an undesirable impurity (that is, an impurity of the opposite type) into the body potential fixing region 22. Consequently, degradation of isolation characteristics between the body potential fixing region 22 and the well 18 can be prevented to provide a semiconductor device with good device characteristics.

While the first embodiment has been described and depicted, for convenience, with respect to an nMOS transistor and a p-type body-potential-fixing region 22 which fixes the potential of the nMOS transistor, the present invention can be applied to devices such as CMOS devices. Therefore, a pMOS transistor and an n-type body-potential-fixing region can be formed in other regions at the same time in a similar manner.

Second Embodiment

Figure 13A:
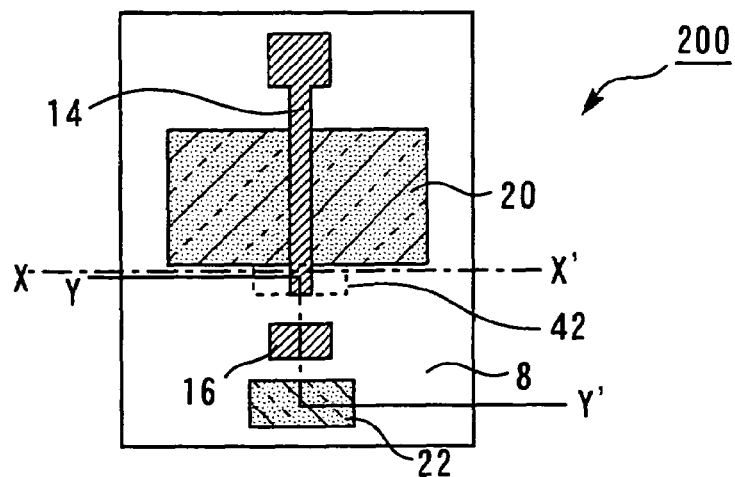
FIGS. 13A to 13C are schematic diagrams illustrating a semiconductor device according to a second embodiment of the present invention.
Figure 13B:
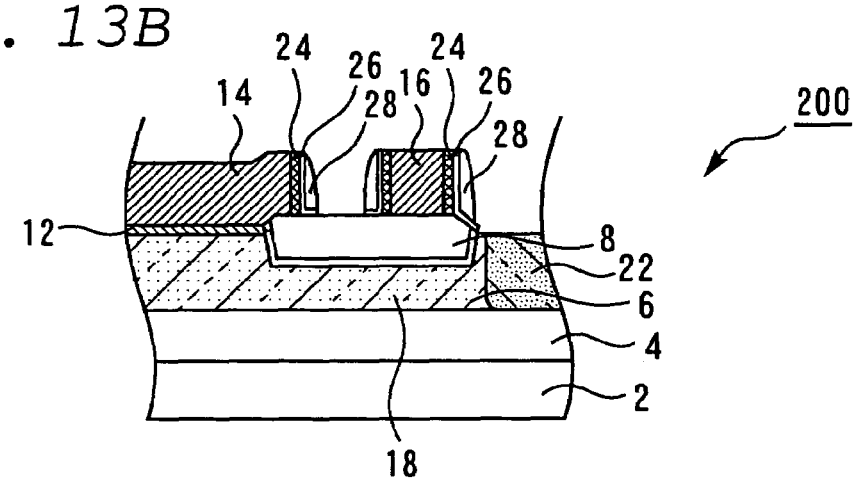
Figure 13C:
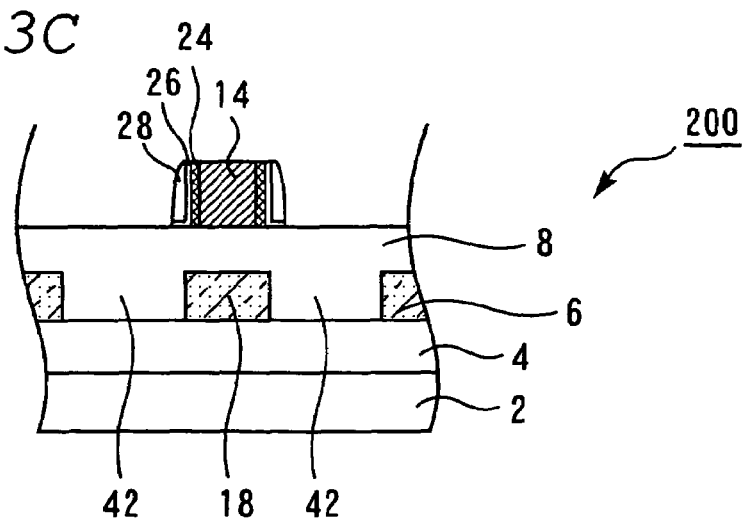
Figure 14A:
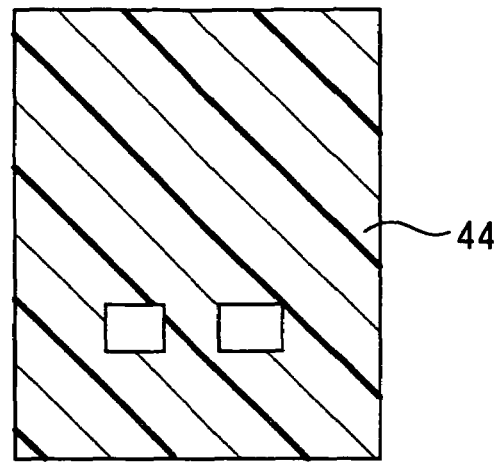
FIGS. 14A to 14C are schematic diagrams illustrating a process for manufacturing the semiconductor device according to the second embodiment of the present invention.
Figure 14B:
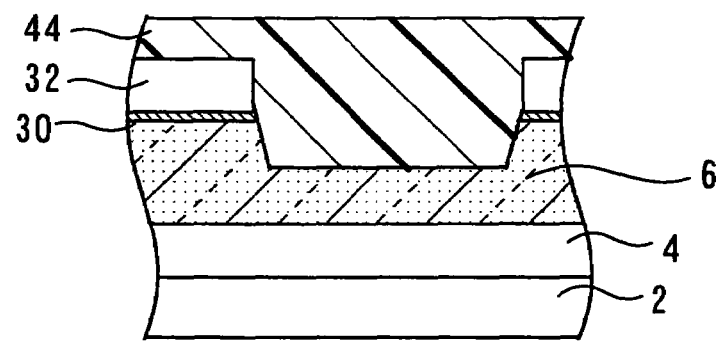
Figure 14C:
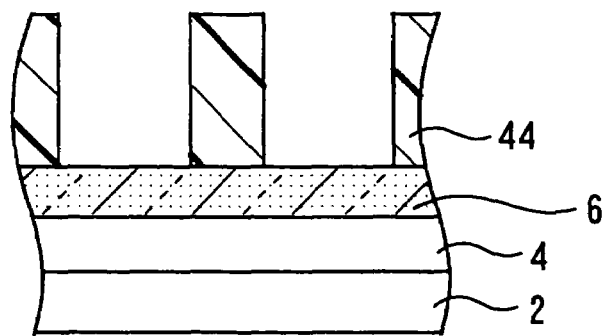

FIGS. 13A to 13C are schematic diagrams illustrating a semiconductor device 200 according to a second embodiment of the present invention. FIG. 13A illustrates a top view of the semiconductor device 200, FIG. 13B is a cross-sectional view taken on line Y-Y' of FIG. 13A, and FIG. 13C is a cross-sectional view taken on line X-X' of FIG. 13A. FIGS. 14A to 14C are schematic diagrams illustrating a process for manufacturing the semiconductor device 200 according to the second embodiment of the present invention. FIGS. 14A to 14C illustrate portions corresponding to those shown in FIGS. 13A to 13C, respectively.

The semiconductor device 200 according to the second embodiment has the same structure as that of the semiconductor device 100 shown in FIGS. 1A and 1B, except that the semiconductor device 200 has a complete isolation insulator (complete isolation region) 42. In particular, the semiconductor device 200, like the semiconductor device 100, has a dummy gate electrode 16 on an partial isolation insulator 8 to inhibit ions from penetrating through the partial isolation insulator 8 into an underlying well 18.

The complete isolation insulator 42 of the semiconductor device 200 is provided on both sides of end 14b of a gate electrode 14, that is, the gate electrode end 14b on the body-potential-fixing-region 22 side. The complete isolation insulator 42 is formed by etching the SOI layer 6 on both sides of the 14b of the gate electrode 14 down to a buried insulator 4 and filling the etched portion with a silicon oxide film, as shown in FIG. 13C.

The provision of the complete isolation insulator 42 at end 14b of the gate electrode 14 can reduce the parasitic capacitance.

The method for manufacturing the semiconductor device 200 is similar to the method for manufacturing the semiconductor device 100, except that a groove for forming the complete isolation insulator 42 is formed after a trench for forming an partial isolation insulator 8 is formed (steps S6 to S10). In particular, as shown in FIGS. 14A to 14C, a resist mask 44 having an opening at the region where the complete isolation insulator 42 is to be provided is formed, then the region of the SOI layer 6 where the complete isolation insulator 42 is to be formed is etched down to the buried insulator 4 by using the resist mask 44 as a mask. Then, the trench and groove formed in the SOI layer 6 are filled with a silicon oxide film and planarized, as in steps S12 to S22 of the first embodiment, thus forming the partial isolation insulator 8 and the complete isolation insulator 42 at a time.

The remainder of the manufacturing method is performed in a similar way as in steps S24 to S40 described with respect to the first embodiment. Thus, the semiconductor device 200 can be completed.

As has been described above, a complete isolation insulator 42 is formed on both sides of one end of the gate electrode in the second embodiment. This completely isolates both sides of the end 14b of the gate electrode 14 from each other. Accordingly, the resistance between the channel region under the gate electrode 14 and the body potential fixing region 22 can be minimized and therefore the body potential can be fixed more stably.

Furthermore, the semiconductor device can be manufactured with a minimum number of additional steps because the complete isolation insulator 42 and the partial isolation insulator 8 can be formed at a time.

While the second embodiment has been described with respect to a case where the complete isolation insulator 42 is formed on both sides of the end 14b of the gate electrode 14, the present invention is not so limited. For example, the complete isolation insulator can be formed on both sides of the other end 14a of the gate electrode 14 in a similar manner. This can also reduce the resistance of the transistor. Furthermore, formation of a complete isolation insulator is not limited to selective formation described above. For example, a complete isolation insulator may be formed by removing all of the SOI layer 6 except the portions where the SOI layer 6 must be left, such as active a region where a transistor is to be formed, a region where a body potential fixing region 22 is to be formed, and a region where a well 18 interconnecting the channel region under the gate and the body potential fixing region 22 is to be formed. This can further reduce the resistance of the transistor.

Figure 15A:
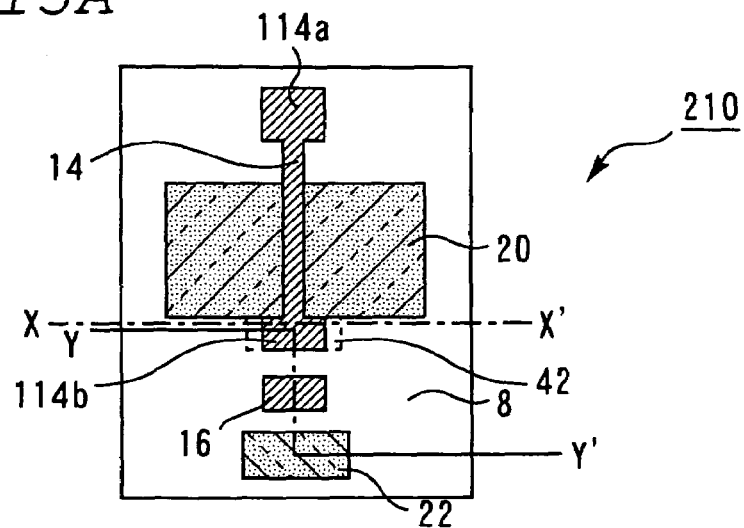
FIGS. 15A to 15C are schematic diagrams illustrating another exemplary semiconductor device according to the second embodiment.
Figure 15B:
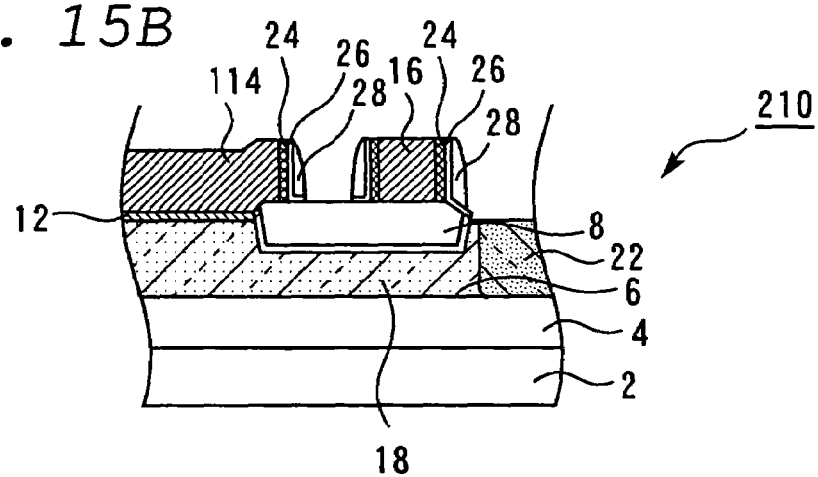
Figure 15C:
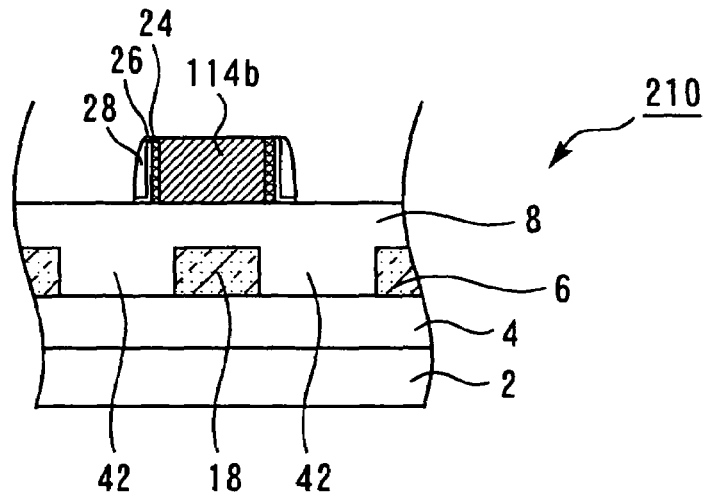

FIGS. 15A to 15C are schematic diagrams illustrating another exemplary semiconductor device according to the second embodiment. FIG. 15A is a top view and FIGS. 15B and 15C illustrate cross-sections taken on line Y-Y' and line X-X', respectively, of FIG. 15A.

The semiconductor device 210 shown in FIGS. 15A to 15C is the same as the semiconductor device 200 in FIGS. 13A to 13C, except that the gate electrode 14 is replaced with a gate electrode 114 having a shape as shown in FIGS. 15A to 15C. In particular, end 114b of the gate electrode 114 is horizontally (in the X-direction) widened when viewed from above. The overlap between end 114b of the gate electrode 114 and the complete isolation insulator 42 is large because of the widened end 114b of the gate electrode 114. By widening end 114b of the gate electrode 114 to enlarge the overlap with the complete isolation insulator 42 in this way, the margin for alignment between the complete isolation insulator 42 and gate electrode 114 during exposure of the complete isolation insulator 42 and gate electrode 114 can be increased. Furthermore, if a misalignment occurs, the 114b of the gate electrode 114 and the complete isolation insulator 42 can be overlapped without fail. Thus, the parasitic capacitance can be further reduced by an amount equivalent to the overlap of the end 114b of the gate electrode 114 and the complete isolation insulator 42.

Third Embodiment

Figure 16A:
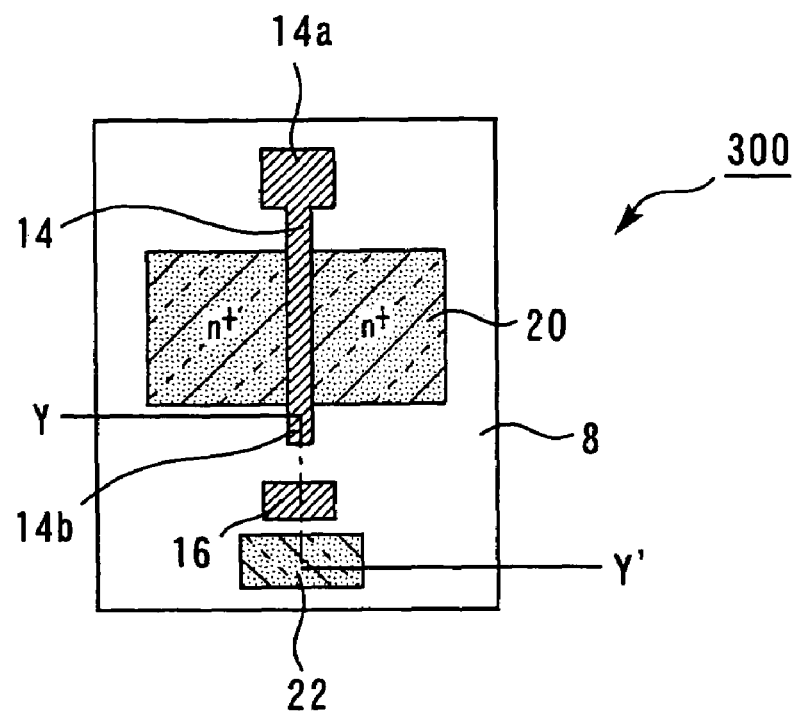
FIGS. 16A and 16B are schematic diagrams illustrating a semiconductor device according to a third embodiment of the present invention.
Figure 16B:
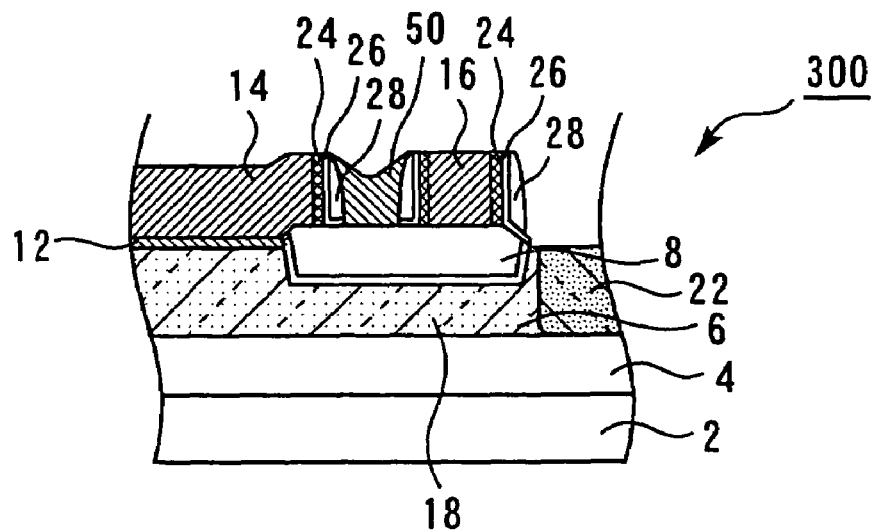

FIGS. 16A and 16B are schematic diagrams illustrating a semiconductor device 300 according to a third embodiment of the present invention. FIG. 16A illustrates a top view of the semiconductor device 300 and FIG. 16B illustrates a cross-section taken on line Y-Y' of FIG. 16A.

The semiconductor device 300 according to the third embodiment shown in FIGS. 16A and 16B is the same as the semiconductor device 100 in FIGS. 1A and 1B, except that the space between a gate electrode 14 and a dummy gate electrode 16 is filled with a silicon oxide film 50 (second isolator).

Figure 17:
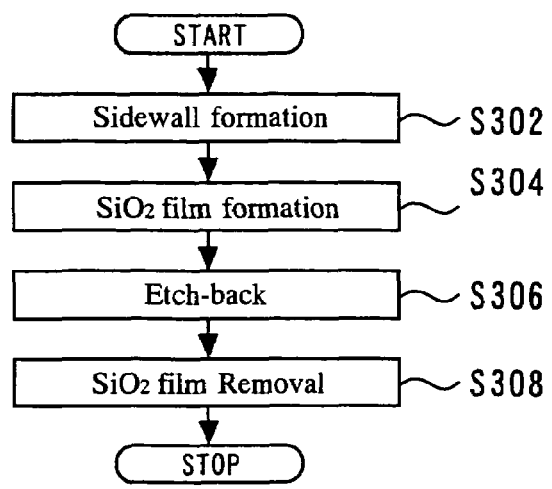
FIG. 17 is a flowchart illustrating a method for manufacturing the semiconductor device according to the third embodiment of the present invention.
Figure 18A:
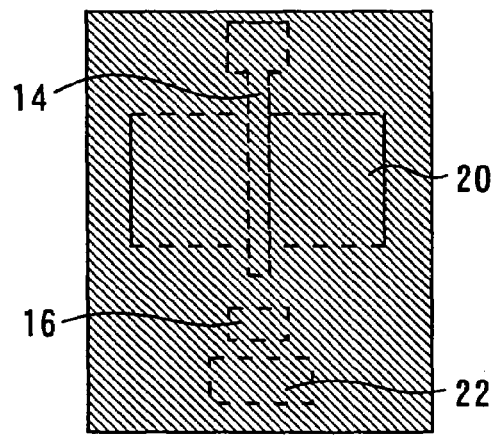
FIGS. 18A and 18B are schematic cross-sectional views illustrating process steps for manufacturing the semiconductor device according to the third embodiment of the present invention.
Figure 18B:
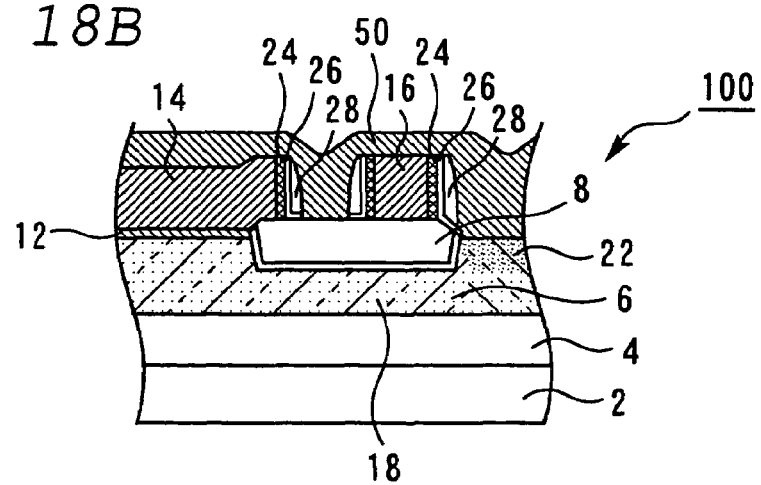

FIG. 17 is a flowchart illustrating a method for manufacturing the semiconductor device 300 according to the third embodiment. FIGS. 18A and 18B are schematic cross-sectional views illustrating process steps for manufacturing the semiconductor device 300. FIGS. 18A and 18B illustrate portions corresponding to those in FIGS. 16A 16B, respectively.

The manufacturing process shown in the flowchart of FIG. 17 is performed between steps S34 and S38 of the manufacturing process shown in the flowchart of FIG. 2. That is, after steps similar to steps S2 to S34 are performed, sidewalls (26, 28) are formed (step S302) in a manner similar to that at step S36.

Then, the space between the gate electrode 14 and the dummy gate electrode 16 is filled with a silicon oxide film 50 (step S304) as in FIGS. 18A and 18B. In particular, a silicon oxide film 50 is first formed on the entire surface of the substrate on which all elements up to the sidewalls (26, 28) are formed. The thickness $T_{50}$ of the silicon oxide film 50 to be formed is such that the following Equation (1) is satisfied:

$$T_{50} \geq (Y-2X)/2 \tag{1}$$

Here, X represents the width of the widest portion the sidewall (26, 28) and a spacer 24 and Y represents the distance between a gate electrode 14 and a dummy gate electrode 16 (or the distance between dummy gate electrodes 16).

Then, etch-back is performed using anisotropic etching (step S306). During this etch-back, the silicon oxide film 50 having the shape of a spacer is formed on the sides of the gate electrode 14 or the dummy gate electrode 16 in a portion where the distance to a nearby elements is large. On the other hand, the silicon oxide film 50 is buried in a portion where the distance to a nearby elements is small, such as the portion where the gate electrode 14 opposes the dummy gate electrode 16. In this way, the space between the gate electrode 14 and the dummy gate electrode 16 is filled with the silicon oxide film 50.

Then, the silicon oxide film 50 having the shape of a spacer left on the sides of the gate electrode 14 or dummy gate electrode 16 in the portion where the distances to the nearby elements are large is removed (step S308). Thus, the silicon oxide film 50 filling the space between the dummy gate electrode 16 and the gate electrode 14 is formed.

As with the first embodiment, ion implantation is performed for forming the source/drain in the impurity diffused layers 20 at step S38 in FIG. 2. Because the space between the dummy gate electrode 16 and the gate electrode 14 is filled with the silicon oxide film 50, ions are inhibited from penetrating into the partial isolation insulator 8 through the space between the dummy gate electrode 16 and the gate electrode 14 during the ion implantation.

Thus, the semiconductor device 300 shown in FIGS. 16A and 16B is provided.

As has been described above, according to the third embodiment, the silicon oxide film 50 is formed to fill the space between the gate electrode 14 and the dummy gate electrode 16 after the sidewalls (26, 28) are formed. Therefore, ions can be more reliably prevented from penetrating into the partial isolation insulator 8 during source/drain implantation. Accordingly, also in the portion of the SOI layer 6 between the gate electrode 14 and the dummy gate electrode 16, ions can be inhibited from penetrating through the partial isolation insulator 8, thereby preventing degradation of isolation characteristics of the semiconductor device further reliably.

While the third embodiment has been described with a case where the space between the gate electrode 14 and the dummy gate electrode 16 in the semiconductor device 100 in the first embodiment 1 is filled with a silicon oxide film 50, the present invention is not so limited. For example, the third embodiment can be combined with any of the other semiconductor devices described in the first and second embodiments. For example, it can be combined with the structure in which the body potential fixing region 22 and the dummy gate electrode 16 partially overlap as described with respect to a variation of the first embodiment (FIGS. 12A and 12B), the structure in which a complete isolation insulator 42 is provided as in the semiconductor device 200 described in the second embodiment (FIGS. 13A to 13C), or a structure in which one end 114b of the gate electrode 114 is wide (FIGS. 15A to 15C).

While the third embodiment has been described with a case where the silicon oxide film 50 is formed such that it has the thickness as given by Equation (1), the present invention is not so limited. The silicon oxide film 50 may have any thickness that can reliably fill the space between the dummy gate electrode 16 and the gate electrode 14.

Fourth Embodiment

Figure 19A:
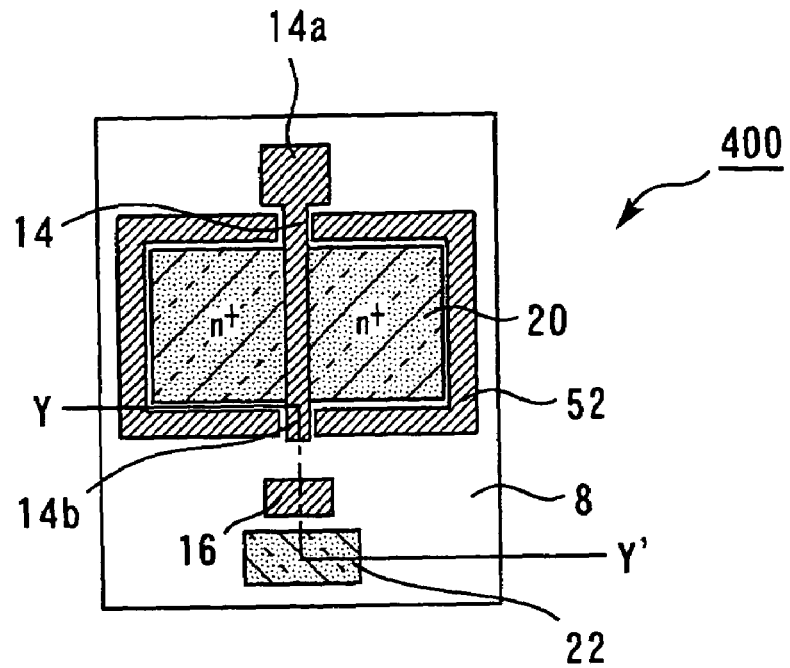
FIGS. 19A and 19B are schematic diagram illustrating a semiconductor device according to a fourth embodiment of the present invention.
Figure 19B:
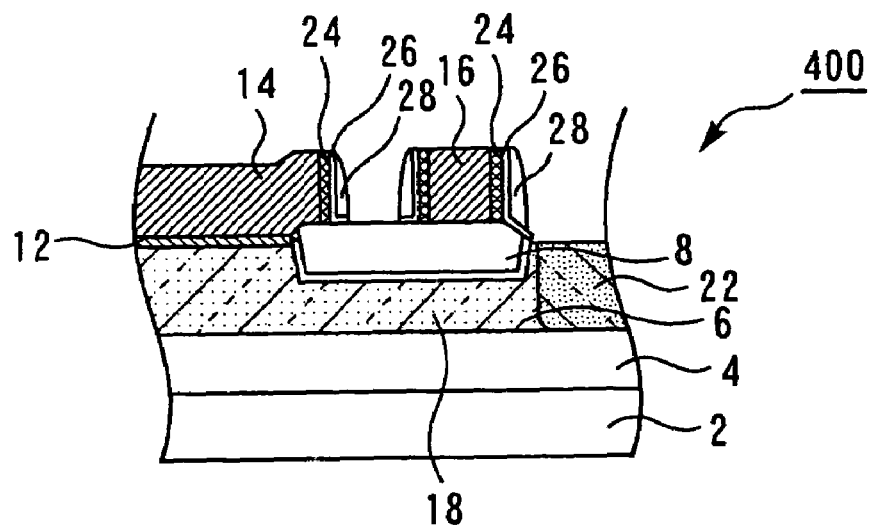

FIGS. 19A and 19B are schematic diagram illustrating a semiconductor device 400 according to a fourth embodiment of the present invention. FIG. 19A illustrates a top view of the semiconductor device and FIG. 19B illustrates a cross-section taken on line Y-Y' of FIG. 19A.

The semiconductor device 400 according to the fourth embodiment is the same as the one shown in FIGS. 1A and 1B, except that a dummy gate electrode 52 surrounding impurity diffused layers 20 is formed as shown in FIGS. 19A and 19B. As with the sides of the dummy electrode 16, formed on the side of the dummy gate electrode 52 is a spacer 24 made of a silicon oxide film, and a sidewall made of a silicon oxide film 26 and a silicon nitride film 28. The combined thickness of the spacer 24 and the sidewall (26, 28) is equal to the distance between the dummy gate electrode 52 and the impurity diffused layers 20. In other words, the space between the dummy gate electrode 52 and the impurity diffused layers 20 is filled with the spacer 24 and the sidewall (26, 28).

The semiconductor device 400 can be manufactured using a method similar to the method for manufacturing the semiconductor device 100. However, for patterning (step S28) after polysilicon for forming a gate electrode 14 is deposited, a resist mask is also formed on a portion where dummy gate electrode 52 is to be formed, and is used as a mask in etching. Thus, the dummy gate electrode 52 can be formed together with the gate electrode 14 and the dummy gate electrode 16 at a time. The spacer 24 and the sidewall on the side of the dummy gate electrode 52 can be formed together with the spacers 24 and sidewalls (26, 28) of the gate electrode 14 and dummy gate electrode 16 at a time. The combined thickness of the spacer 24 and sidewall is preferably controlled to ensure that the space between the impurity diffused layers 20 and the dummy gate electrode 52 is filled.

As has been described, the dummy gate electrode 52 is formed surrounding the impurity diffused layers 20 in the semiconductor device 400. This can more effectively inhibit ions from penetrating through the partial isolation insulator 8 during implantation in the impurity diffused layers (extension and source/drain) 20. Accordingly, ion penetration around the impurity diffused layers 20 can also be inhibited and degradation of isolation characteristics of the SOI layer 6 can be effectively prevented.

While the fourth embodiment has been described with respect to a case where a dummy gate electrode 52 is formed around a semiconductor device 100 similar to the one in the first embodiment, the present invention is not so limited. For example, the dummy gate electrode 52 may be combined with any of the other semiconductor devices described in the first to third embodiments.

Figure 20:
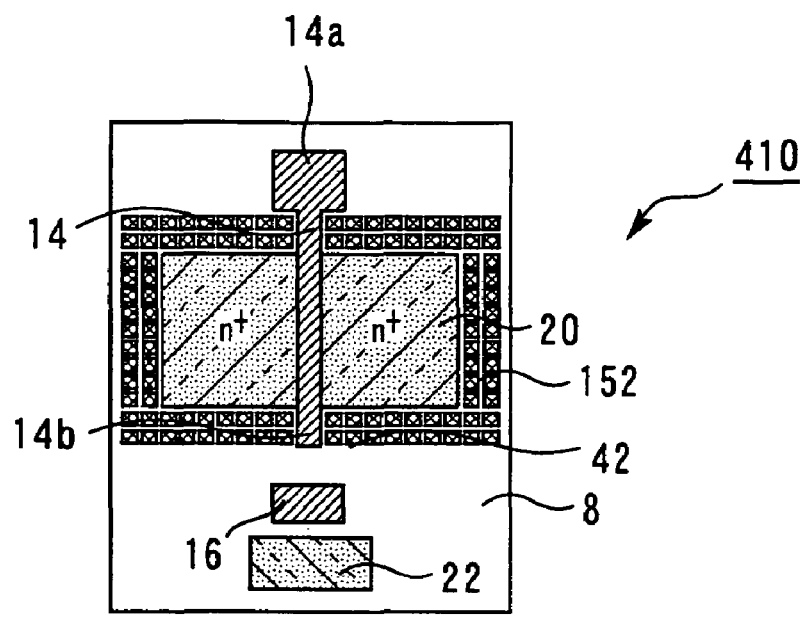
FIG. 20 is a schematic diagram illustrating another exemplary semiconductor device according to the fourth embodiment of the present invention.

FIG. 20 is a schematic diagram illustrating another exemplary semiconductor device 410 according to the fourth embodiment. As shown in FIG. 20, a dummy gate electrode 152 is formed in the semiconductor device 410. Unlike the dummy gate electrode 52 in the semiconductor device 400, which is one integral element, the dummy gate electrode 152 in the semiconductor device 410 has multiple small dummy gate electrode segments arranged to occupy the region equivalent to the region occupied by the dummy gate electrode 52. Each segment of the dummy gate electrode 152 is sized to design rule minimum dimensions and the space between the adjacent dummy gate electrodes 152 is filled with a silicon oxide film or silicon nitride film during sidewalls or the like are formed.

This arrangement also can reduce the resistance of the semiconductor device. In addition, because the dummy gate electrode 152 is segmented, the flatness of an insulator subsequently formed to cover the gate electrodes and other elements can be improved in CMP planarization.

Figure 21:
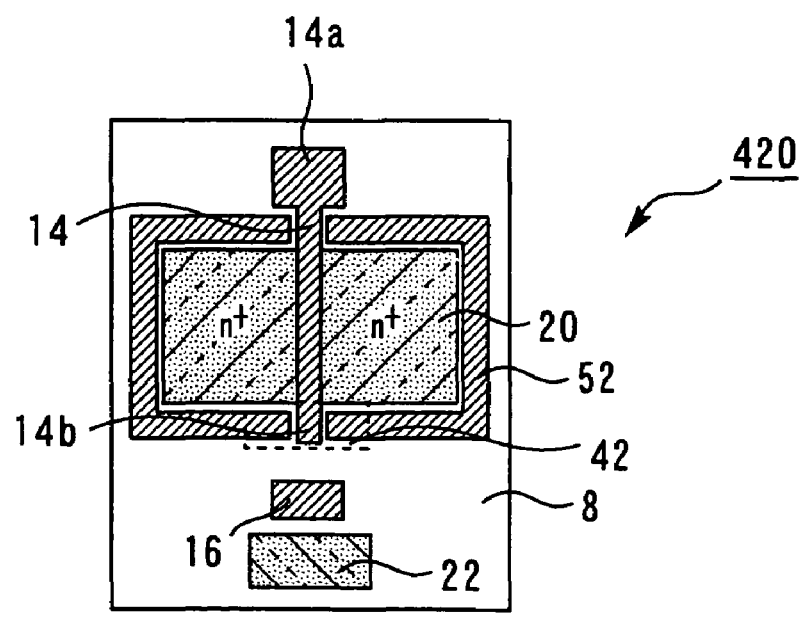
FIG. 21 is a schematic diagram illustrating another exemplary semiconductor device according to the fourth embodiment of the present invention.

FIG. 21 is a schematic diagram illustrating another exemplary semiconductor device 420 according to the fourth embodiment of the present invention.

The semiconductor device 420 shown in FIG. 21 has the same structure as that of the semiconductor device 400 shown in FIGS. 19A and 19B, except that a complete isolation insulator 42 is provided on both sides of one end 14b of a gate electrode 14 as in the semiconductor device 200 shown in FIGS. 13A to 13C. That is, the SOI layer 6 on both sides of end 14b of the gate electrode is etched down to the buried insulator 4 and the etched portion is filled with a silicon oxide film. As shown in FIG. 21, ends of the dummy electrode 52 overlap the both ends of the complete isolation insulator 42 in the semiconductor device 420. The provision of the complete isolation insulator 42 in the semiconductor device having the dummy gate electrode 52 can reduce the parasitic capacitance to improve the device characteristics of the semiconductor.

Fifth Embodiment

FIGS. 22A to 24B are schematic diagrams illustrating process steps for manufacturing a semiconductor device according to a fifth embodiment of the present invention. FIGS. 22A, 23A and 24A and FIGS. 22B, 23B and 24B show portions corresponding to those in FIGS. 1A and 1B, respectively.

The semiconductor device 500 according to the fifth embodiment is the same as the semiconductor device 100 shown in FIGS. 1A and 1B, except that the shape of the gate electrode 60 is different.

In particular, the gate electrode 60 in the semiconductor device 500 is longer in the longitudinal direction than that of the semiconductor device 100. However, the length in the Y-direction of the portion on both sides of which an impurity diffused layers 20 are formed is the same as that of the semiconductor device 100 and the length of the end 60b of the gate electrode 60 on both sides of which the impurity diffused layers 20 are not formed is longer than that in the semiconductor device 100.

Figure 22A:
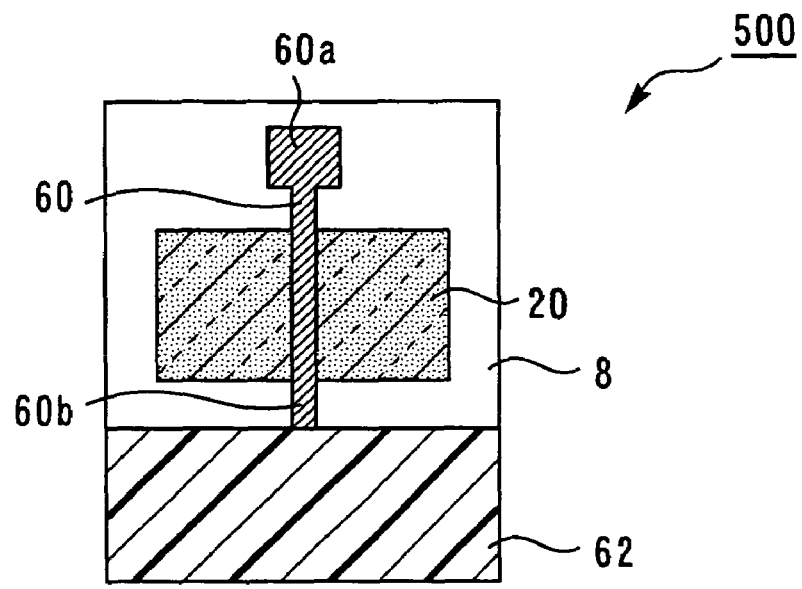
FIGS. 22A to 24B are schematic diagrams illustrating process steps for manufacturing a semiconductor device according to a fifth embodiment of the present invention.
Figure 22B:
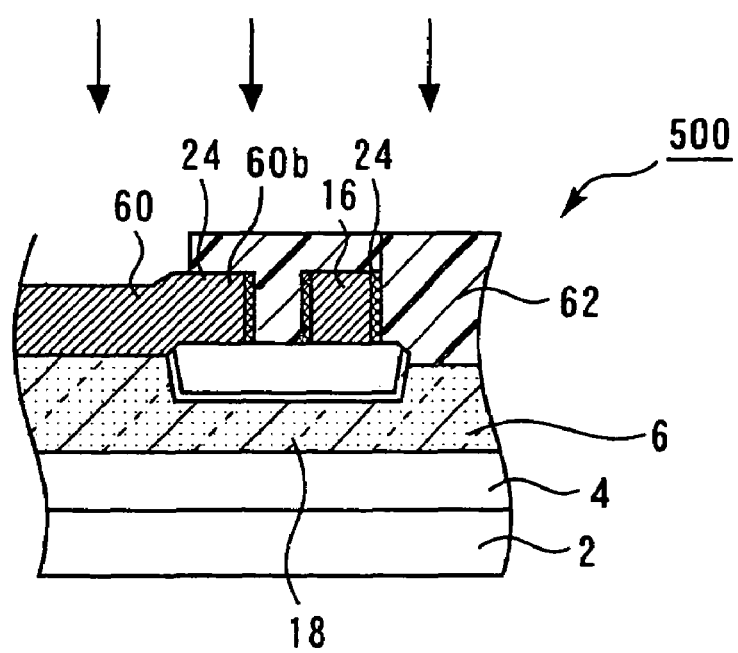

The method for manufacturing the semiconductor device 500 shown in FIGS. 22A and 22B is the same as the method for manufacturing the semiconductor device 100 shown in FIG. 2, except that resist masks used during ion implantation at steps S32, S34, S38, and S40 vary in shape. In particular, a resist mask 62 which is formed on the body potential fixing region 22 side before an extension of the impurity diffused layers 20 is formed (step S32) extends to cover a portion of the end 60b of the elongated gate electrode 60, as shown in FIG. 22. The end 60b of the gate electrode 60 is longer than regular gate electrodes. Therefore, the region on the both side of the end 60b of the gate electrode 60 where the impurity diffused layers 20 is not provided does not cause a problem.

Figure 23A:
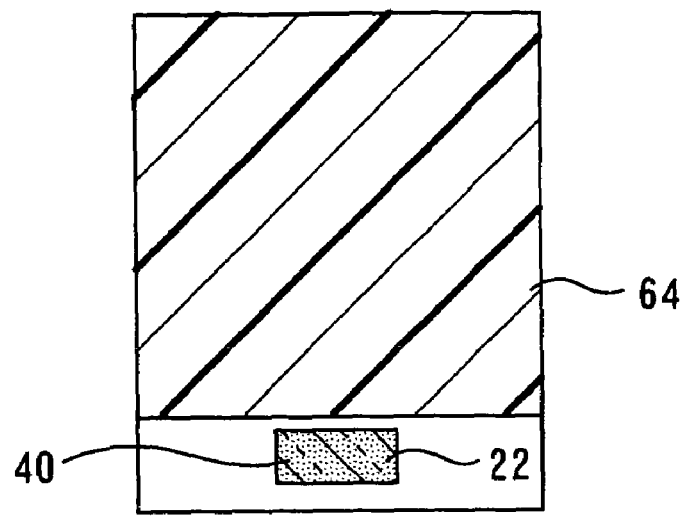
Figure 23B:
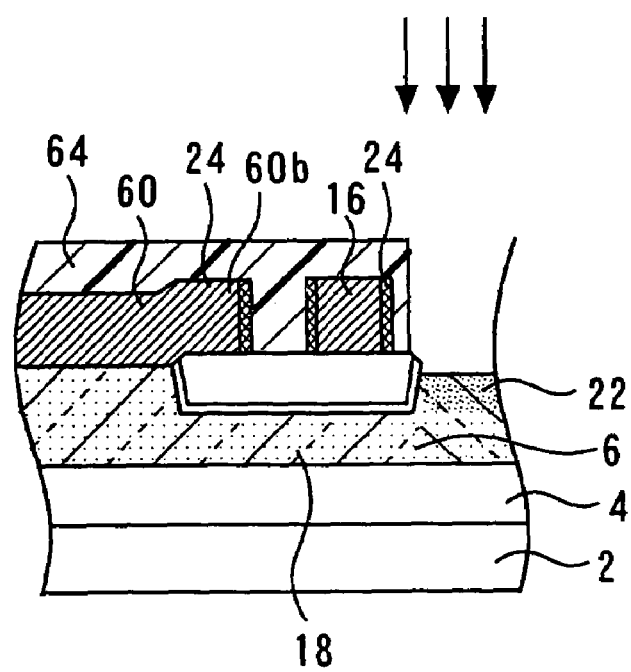

For ion implantation into the body potential fixing region 22 (step S34), a resist mask 64 is formed so as to cover a portion of a dummy gate 16 on the side opposite the gate electrode 60 as shown in FIGS. 23A and 23B. The provision of the resist mask 64 in this way does not cause a problem, because a partial isolation insulator 8 is formed under the dummy gate electrode 16 and the portion does not need ion implantation. Covering the portion of the dummy gate electrode 16 with the resist mask 64 can inhibit ions implanted with ion implantation into the body potential fixing region 22 from penetrating through the partial isolation insulator 8 into the well to increase its resistance.

Figure 24A:
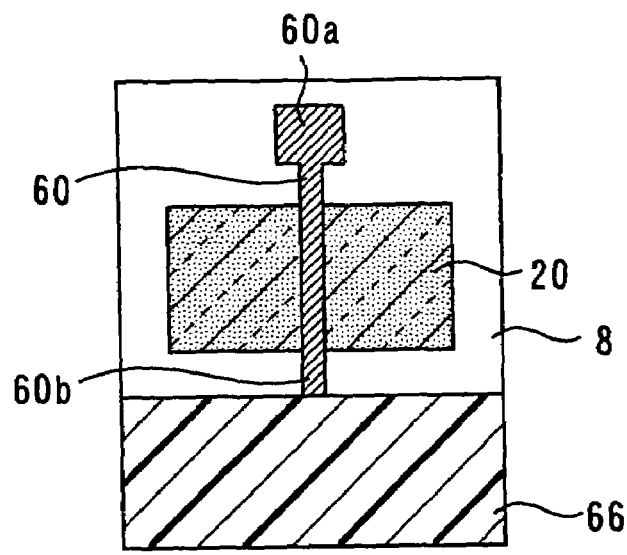
Figure 24B:
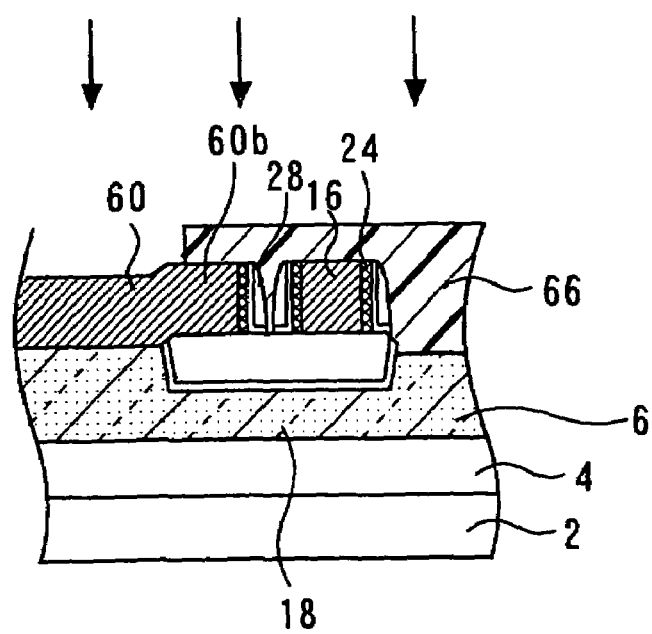

Similarly, after sidewalls are formed, as in FIGS. 24A and 24B, a resist mask 66 is provided in such a manner that it covers the portion of the end 60b of the gate electrode 60 and ion implantation for the source/drain in the impurity diffused layers 20 is performed. Then, before ion implantation into the body potential fixing region 22, a resist mask is formed in a manner similar to that shown in FIGS. 22A and 22B.

As has been described above, there is a region always covered with a resist mask during ion implantation because the resist masks 62 and 66 are extended to cover the end 60b of the gate electrode 60. This region is a portion of the surface of the partial isolation insulator 8 where penetration of ions must be inhibited. Therefore, by always covering the portion with a resist mask, ions can be inhibited from penetrating through the partial isolation insulator 8 into the SOI layer 6 during ion implantation. Thus, degradation of isolation characteristics of the SOI layer 6 can be prevented.

It should be noted that the tolerance of alignment of resist masks with the gate electrode 60 is large because the length of the gate electrode 60 is elongated. Therefore, a misalignment of resist mask 62 or 66 with the gate electrode 60 can be inhibited to provide a semiconductor device the resistance of which is more reliably reduced.

While the fifth embodiment has been described with respect to an example with which a semiconductor device 100 of the first embodiment is combined, the present invention is not so limited. For example, the fifth embodiment can be combined with any of other semiconductor devices described in the first to fourth embodiments to form overlapped resist masks in process steps. This can inhibit ion penetration through the partial isolation insulator 8 more reliably to reduce the resistance of the semiconductor device.

Sixth Embodiment

Figure 25:
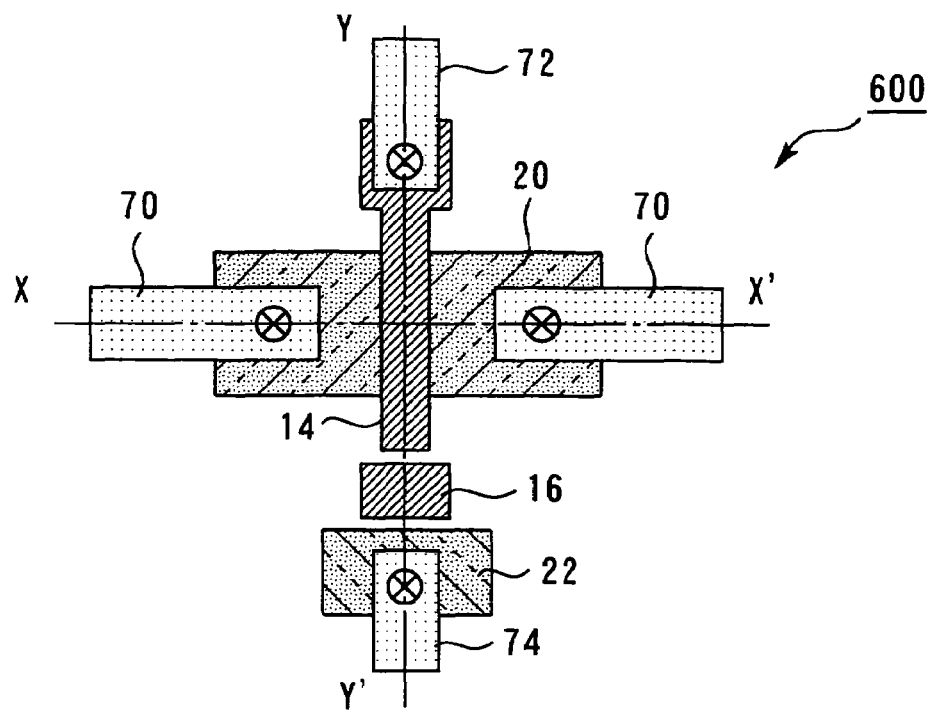
FIG. 25 is a top view illustrating a semiconductor device according to a sixth embodiment of the present invention.
Figure 26:
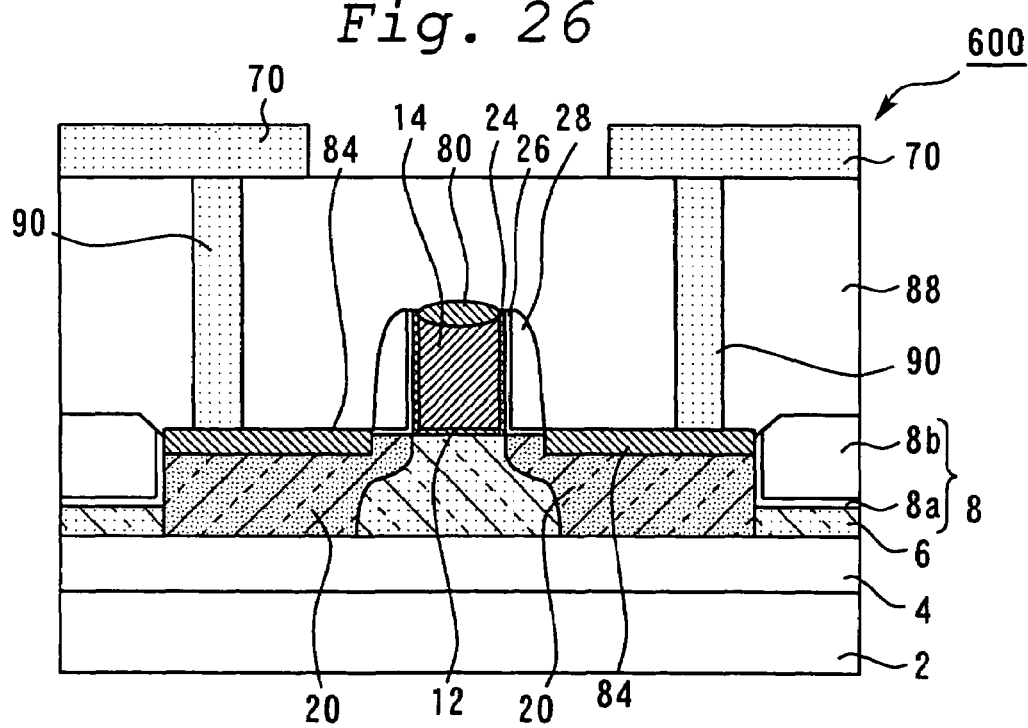
FIGS. 26 and 27 are cross-sectional views of the semiconductor device according to a sixth embodiment of the present invention.
Figure 27:
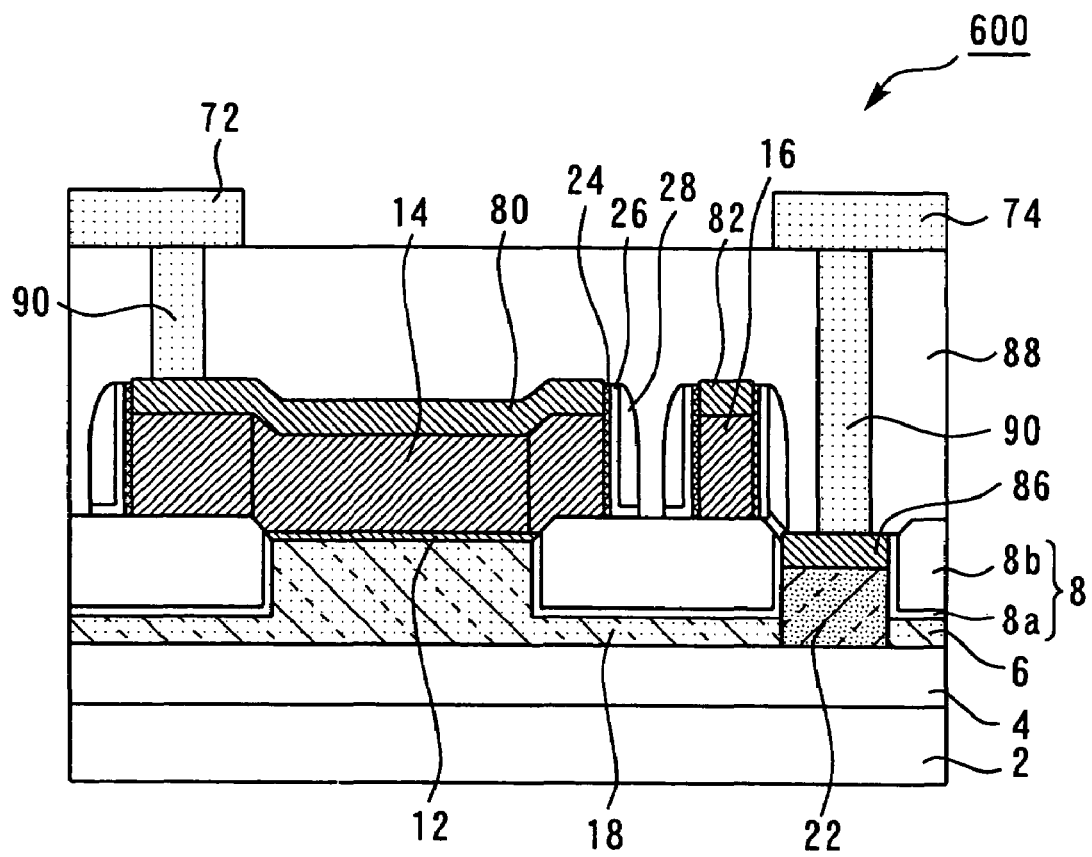

FIG. 25 is a top view illustrating a semiconductor device 600 according to a sixth embodiment of the present invention. For indicating electric connections, only wirings, electrode, and a diffusion layer are shown. FIGS. 26 and 27 are cross-sectional views of the semiconductor device 600, showing cross-sections taken on line X-X' and line Y-Y' of FIG. 25, respectively.

As shown in FIG. 25, the semiconductor device 600 is a semiconductor device 100 described in the first embodiment to which wirings 70, 72, and 74 are attached.

Referring to FIGS. 26 and 27, in the semiconductor device 600, a partial isolation insulator 8 is formed on an SOI substrate consisting of a underlying silicon substrate 2, a buried insulator 4, and an SOI layer 6, and a gate electrode 14 is formed on a gate insulator 12, as in the first embodiment. Also formed on the partial isolation insulator 8 is a dummy gate electrode 16. Impurity diffused layers 20 and a body potential fixing region 22 are formed in predetermined locations in the SOI layer 6. On the sides of the gate electrode 14 and dummy gate electrode 16, a spacer 24, a silicon oxide film 26, and a silicon nitride film 28 are formed. This structure is the same as that described with respect to the first embodiment and the dummy gate electrode 16 inhibits ions from penetrating through the partial isolation insulator 8 into the layer immediately below it.

The surface of the gate electrode 14 and the dummy gate electrode 16 and a portion of the surface of the impurity diffused layers 20, and the surface of the body potential fixing region 22 are silicided to form metal silicide layers 80, 82, 84, and 86. An interlayer film 88 is formed over the SOI layer 6 to cover the gate electrode 14, the dummy gate electrode 16, and other elements. Contacts 90 are formed in the interlayer film 88. The contacts 90 connect the impurity diffused layers 20 to aluminum wirings 70, the gate electrode 14 to an aluminum wiring 72, and the body potential fixing region 22 to an aluminum wiring 74.

One example of the sixth embodiment has been described in which wirings are provided on the upper layer of the semiconductor device 100. However, connections of wirings with the gate electrode 14 and the impurity diffused layers 20 are not limited to this example but other structure may be used. These connections can be provided in any of other semiconductor devices 200-500 of the second to fifth embodiments, of course. That is, wirings and plugs are formed in appropriate locations and are electrically connected to the gate electrodes, impurity diffused layers, and body potential fixing region in the semiconductor devices 200-500 described with respect to the first to fifth embodiments.

It should be noted that the SOI substrate consisting of the underlying silicon substrate 2, buried insulator 4, and the SOI layer 6 in the first to sixth embodiments represents a "substrate" including an "underlying silicon substrate", a "buried insulator", and a "semiconductor layer" of the present invention, the gate electrode 14 or 60 represents a "first gate electrode" of the present invention, the dummy gate electrode 16 or 116 represents a "second gate electrode" of the present invention, and the impurity diffused layers 20, the body potential fixing region 22, and the partial isolation insulator 8 represent an "impurity diffused region", a "second impurity diffused region", and a "first insulator", respectively, of the present invention. The complete isolation insulator 42 according to the second embodiment, for example, represents a "complete isolation insulator" of the present invention and end 114b of the gate electrode in the variation of the second embodiment 2 represents a "portion formed on the complete isolation insulator". The silicon oxide film 50 in the third embodiment, for example, represents a "second insulator" of the present invention and the dummy gate electrodes 52, 152 in the fourth embodiment, for example, represent a "third gate electrode" of the present invention.

Furthermore, a "first insulator forming step" is implemented by performing steps S2 to S20, for example; a "first and second gate electrode forming step" is implemented by performing steps S26 to S28; a "first resist mask forming step", a "first impurity implanting step", and a "first resist mask removing step" are implemented by performing step S30 or S32; and a "second resist mask forming step", a "second impurity implanting step", and a "second resist mask removing step" are implemented by performing step S32 or S34.

Seventh Embodiment

Figure 28A:
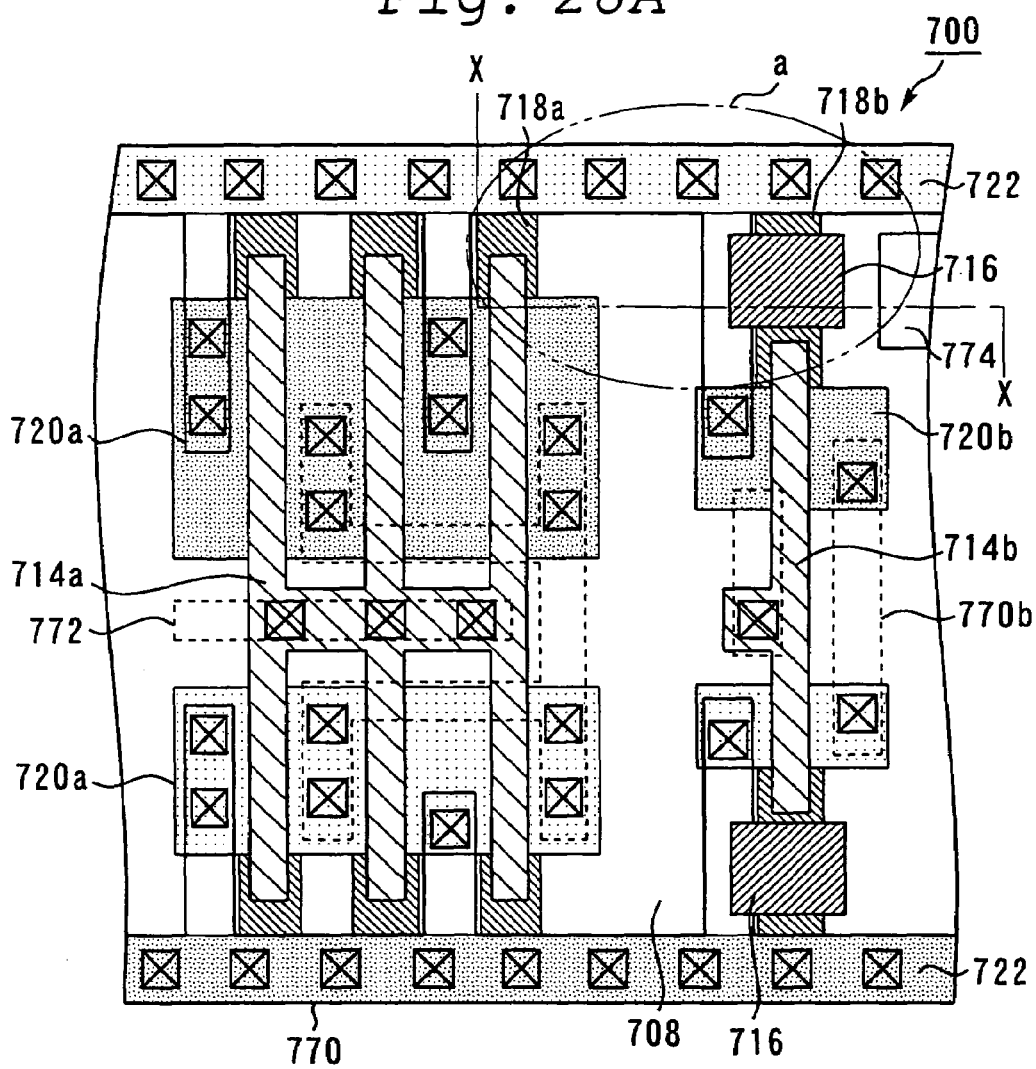
FIGS. 28A and 28B are schematic diagrams illustrating a semiconductor device according to a seventh embodiment of the present invention.
Figure 28B:
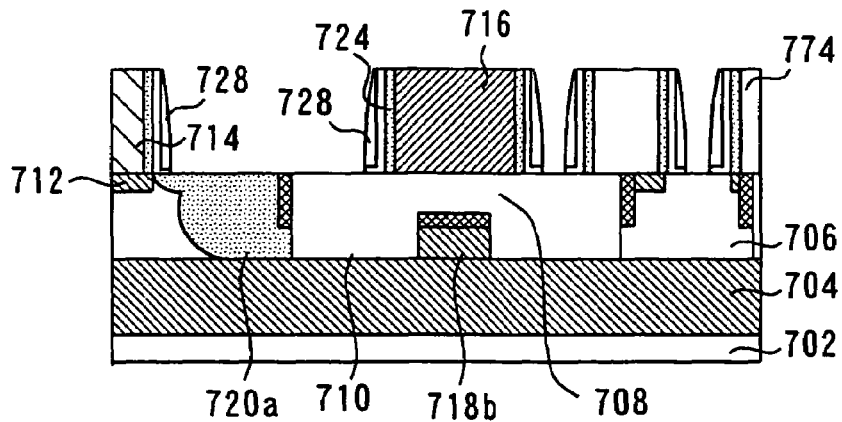

FIGS. 28A and 28B are schematic diagrams illustrating a semiconductor device 700 according to a seventh embodiment of the present invention. FIG. 28A illustrates a top view of the semiconductor device 700 and FIG. 28B illustrates a cross-section taken on line X-X' in the portion enclosed in the ellipse "a" in FIG. 28A. The semiconductor device 700 in the seventh embodiment will be described, which has multiple transistors, each including a gate electrode 714a or 714b and impurity diffused layers 720a or 720b, and in which dummy gate electrodes 716 are provided. For illustrating connections of elements such as electrodes, only electrodes, wirings, and required impurity doped regions are shown in FIG. 28A and the remaining elements are omitted from FIG. 28A. The thin solid lines in FIG. 28A represent impurity doped regions formed on an SOI layer 706 and the thick solid lines represent the gate electrodes 714a and 714b, dummy gate electrodes 716, and a wiring 770 formed in the metallization layer immediately above them. The dotted lines represent wirings 772 formed in upper metallization layers. The semiconductor device 700 shown in FIGS. 28A and 28B is a cMOSFET having pMOSFETs and nMOSFETs formed on the SOI substrate.

In particular, the semiconductor device 700 has an SOI substrate having a multilayered stack of a Si underlying substrate 702, a BOX layer (buried insulator) 704, and an SOI layer (semiconductor layer) 706, as shown in FIGS. 28A and 28B. The SOI substrate is isolated into active areas in which nMOSs and pMOSs are to be formed by a complete isolation insulator 710. The complete isolation insulator 710 is formed by etching the SOI layer 706 down to the BOX layer and filling the etched portion with an oxide film. Gate electrodes 714a and 714b are formed on a gate insulator 712 on active areas. Formed in each of the active areas around the gate electrodes 714a, 714b is impurity diffused layers (extension and source/drain) 720a, 720b (first impurity diffused region).

A well potential fixing region 722 (second impurity diffused region) is formed in the perimeter of the semiconductor device 700. The well potential fixing region 722 on the pMOS side is connected to a channel region (body) under the gate electrode 714a, 714b through a well 718a, 718b for fixing the potential of the body. Therefore, the well potential fixing region 722, as well as the body under the PMOS gate electrode 714a, 714b, is implanted with n-type ions. The well potential fixing region 722 on the nMOS side is connected to a channel region (body) under the gate electrode 714a, 714b through a well 718a, 718b for fixing the potential of the body. Therefore, the well potential fixing region 722, as well as the body under the gate electrode 714a, 714b of the nMOS, is implanted with p-type ions. The well 718a, 718b is formed by implanting ions into a thin portion of the SOI layer 706 which is etched down to a depth in the thickness of the SOI layer 706.

A partial isolation insulator 708 is formed on the well 718a, 718b at the same time when the complete isolation insulator 710 is formed.

As has been stated with respect to the first to sixth embodiments, if ions penetrate into a portion (i.e. the well 718a, 718b) of the SOI layer formed under the partial isolation insulator 708 during ion implantation in the impurity diffused layers 720a, 720b or the well potential fixing region 722, the isolation characteristics of the well can degrade. Therefore, also in the semiconductor device 700, a dummy gate electrode is provided in a PTI (Partial Trench Isolation) region in the partial isolation insulator 708 under which the SOI layer 706 is formed, in order to prevent ion penetration.

However, forming a dummy gate electrode in every PTI region may prohibit reduction of size of the semiconductor device 700. The size of the impurity diffused layers 720a, 720b of each transistor formed in the semiconductor device 700 varies from transistor to transistor. Accordingly, the distance between the well potential fixing region 722 and the impurity diffused layers 720a, 720b also varies from transistor to transistor. Accordingly, it can be difficult to form dummy gate electrodes to fill the space between all gate electrodes 714a, 714b and well potential fixing regions 722, because the space between a gate electrode 714a, 714b and a well potential fixing region 722 can be so small that a dummy gate electrode 716 cannot be formed in accordance with a layout rule. In such a case, the whole semiconductor device could be enlarged to provide space for forming dummy gate electrode 716. However, this is not desirable because this does not meet the demand for reduced semiconductor device size.

On the other hand, the impact of ion penetration during ion implantation is especially large for large (long) PTI regions. For small regions, an increase in its resistance is relatively small. Therefore, especially if the PTI region is large, it is desirable that a dummy gate electrode 716 be used to prevent ion penetration.

For this reason, a dummy gate electrode 716 is provided only in the PTI region between agate electrode 714b and a well potential fixing region 722 where the distance between them is long. A dummy gate electrode is not formed between a gate electrode 714a and a well potential fixing region 722 where the distance between them is short. With this, damage to connections by ion penetration can be inhibited without enlarging the whole semiconductor device.

It should be noted that a dummy electrode 774 is formed in a region near a dummy gate electrode 716 on the partial isolation insulator 708 where no electrode is formed nearby, thereby ensuring a uniform flatness in subsequent CMP.

Figure 29:
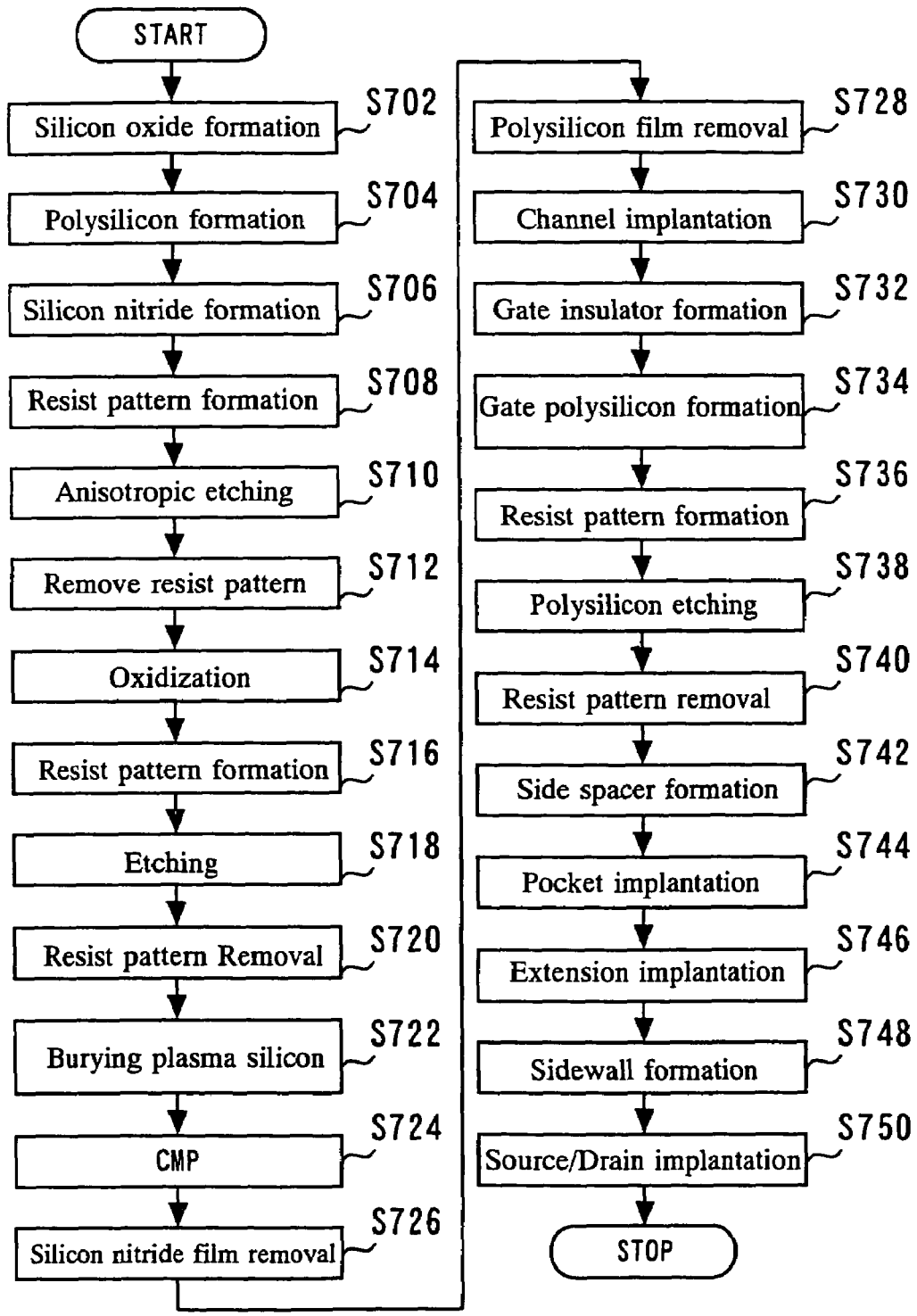
FIG. 29 is a flowchart illustrating a method for manufacturing a semiconductor device according to the seventh embodiment of the present invention.

FIG. 29 is a flowchart illustrating a method for manufacturing a semiconductor device 700 according to the seventh embodiment of the present invention. FIGS. 30 to 38 are schematic cross-sectional view illustrating process steps for manufacturing the semiconductor device 700 according to the seventh embodiment of present invention. FIGS. 30 to 38 show cross-sections corresponding to the one shown in FIG. 28B.

Figure 30:
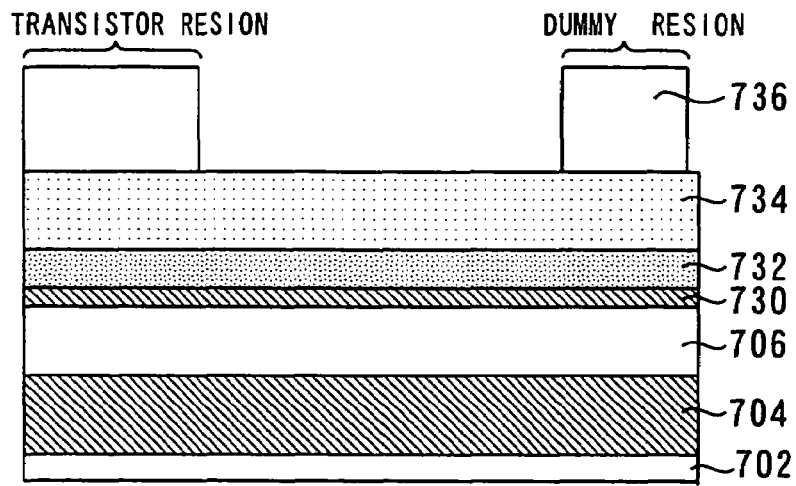
FIGS. 30 to 38 are schematic cross-sectional view illustrating process steps for manufacturing the semiconductor device according to the seventh embodiment of present invention.

First, a silicon oxide film 730, a polysilicon film 732, and a silicon nitride film 734 are formed in this order on top of an SOI substrate consisting of Si underlying substrate 702, a box layer 704, and an SOI layer 706 (steps S702 to 706), and a resist pattern 736 is formed on the silicon nitride film 734 (step S708), as shown in FIG. 30. The resist pattern 736 is formed by photolithography in such a manner that an opening is provided in a region where a partial isolation insulator 708 (or a complete isolation insulator 710) is to be provided.

Figure 31:
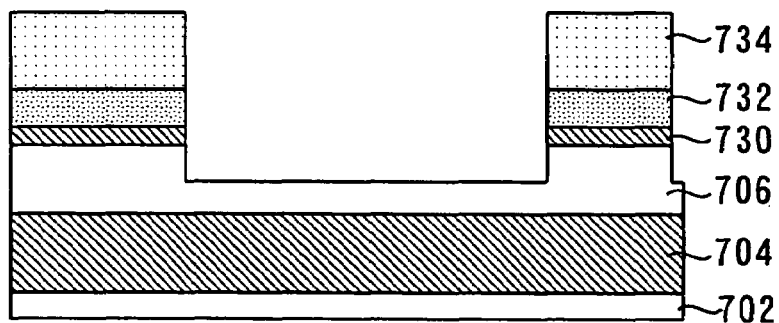

Then, anisotropic etching is performed by using the resist pattern 736 as a mask as shown in FIG. 31 (step S710). As a result, the silicon nitride 734, the polysilicon 732, and the silicon oxide 730 are etched through and the SOI layer 706 is etched to some depth, thereby forming a trench in the SOI layer 706. Unnecessary resist pattern 736 is then removed (step S712).

Figure 32:
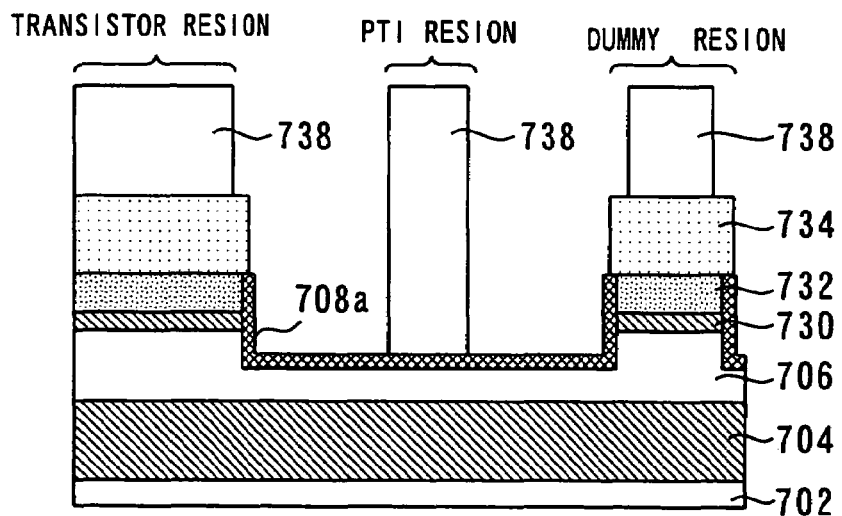

Then, the inner wall of the trench is oxidized to form an oxide film 708a as shown in FIG. 32 (step S714). A resist pattern 738 is then formed in a region where a complete isolation insulator 710 is not to be formed (step S716). In particular, a resist pattern 738 is formed to cover regions where the SOI layer 706 is to be completely left for forming active areas and a region (PTI) where some thickness of the SOI layer 706 is left for forming a well 718a, 718b. The, the SOI layer 706 is etched together with the oxide film 708a formed on the surface by using the resist pattern as a mask (step S718). Unnecessary resist pattern S738 is then removed (step S720).

Figure 33:
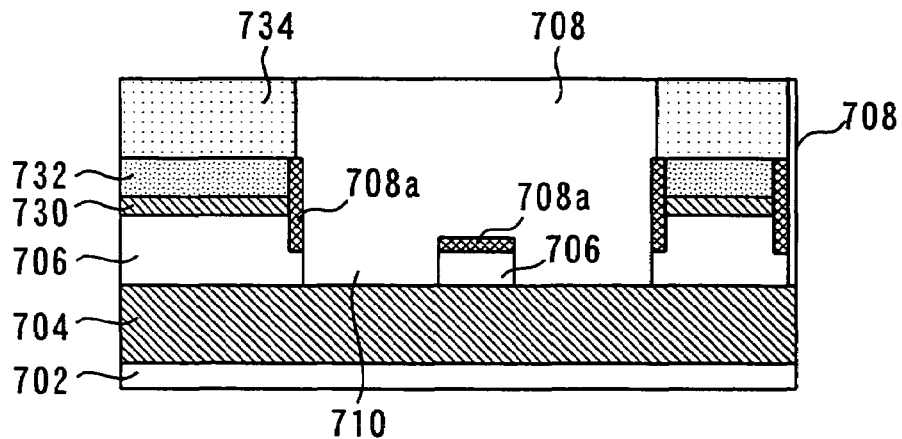

Then, a plasma silicon oxide 708 is formed as shown in FIG. 33 (step S722) and CMP is performed (step S724). The CMP is stopped at the surface of the silicon nitride 734. Then, an unnecessary portion of the plasma silicon oxide 708, and the silicon oxide 734 and the polysilicon 732 are removed (steps S726 to S728).

Figure 34:
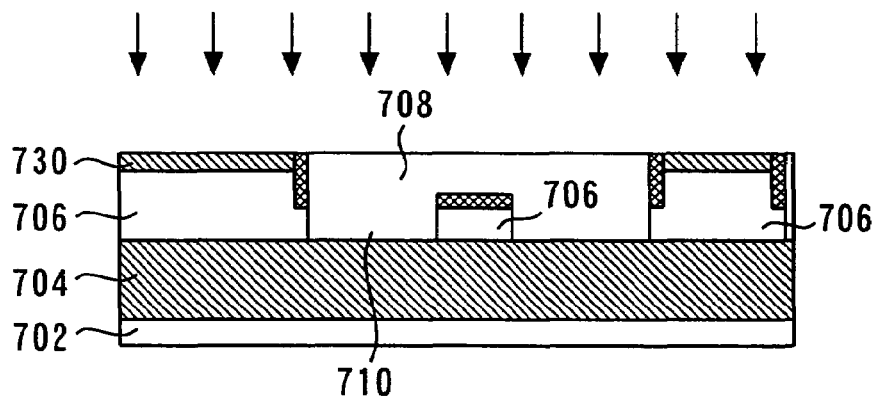

Channel implantation is performed as shown in FIG. 34 (step S730). The semiconductor device 700 is a cMOS having n-type and p-type transistors. Therefore, when channel implantation for the pMOS regions is performed, a resist that covers the nMOS regions is formed and used as a mask to perform channel implantation. When channel implantation for the nMOS regions is performed, a resist that covers the pMOS regions is formed and used as a mask to perform channel implantation.

Figure 35:
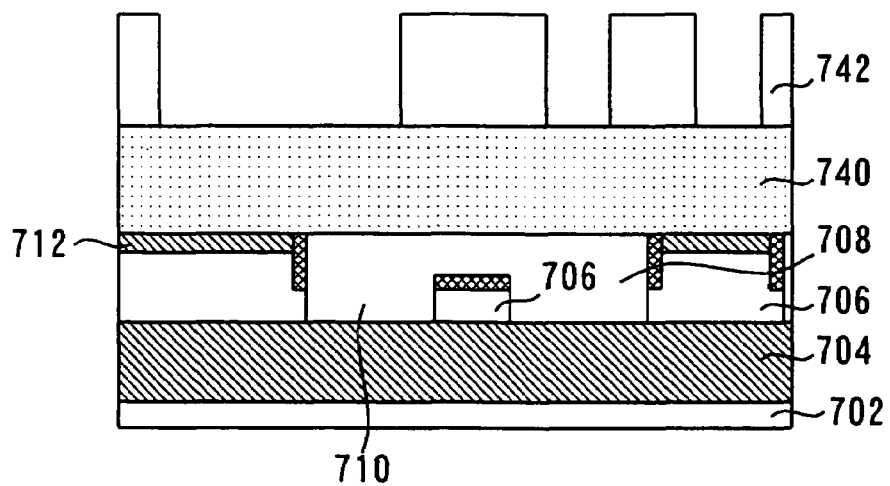

Then, a gate insulator 712 is formed as shown in FIG. 35 (step S732) and a gate polysilicon film 740 is formed (step S734). A resist pattern that covers regions where a gate electrode 714a, 714b, a dummy gate electrode 716, and the dummy electrode 774 are to be formed is formed by a photoresist (step S736).

Figure 36:
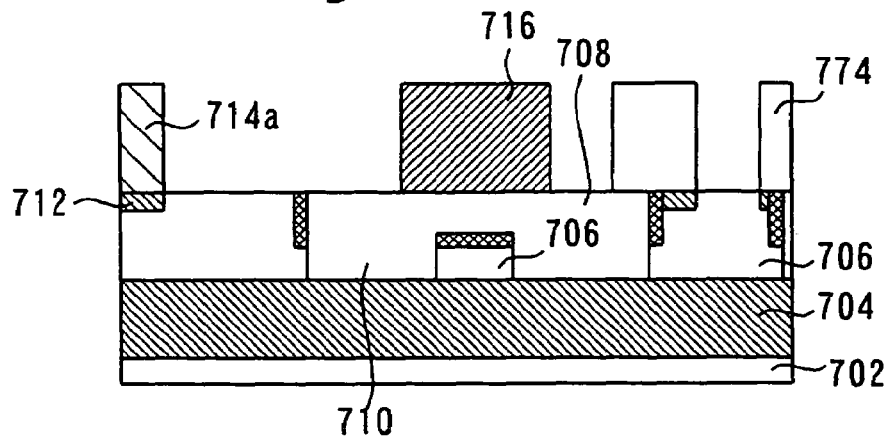

Then, the gate polysilicon 740 is etched by using the resist pattern 742 as a mask, as shown in FIG. 36 (step S738). As a result, a gate electrode 714a, 714b, a dummy gate electrode 716, and a dummy electrode 774 are formed in appropriate locations. Unnecessary resist pattern 742 is then removed (step s740).

Figure 37:
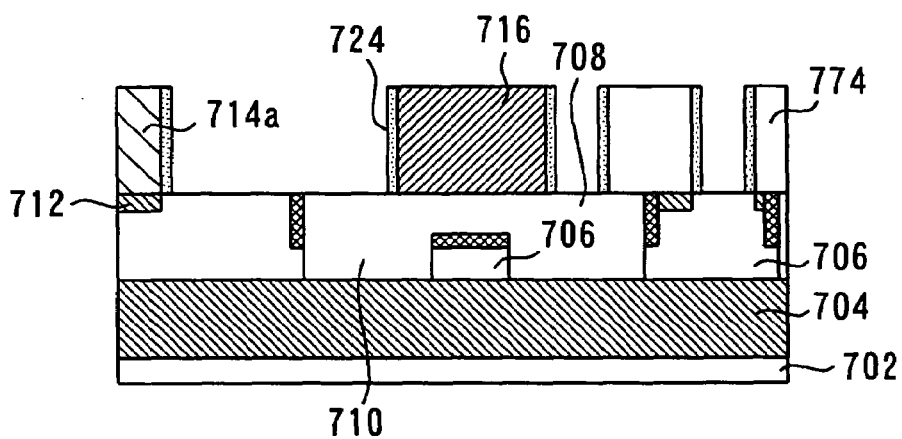

Then, spacers 724 are formed on the sides of the gate electrode 714a, 714b, dummy gate electrode 716, and dummy electrode 774 as shown in FIG. 37 (step S742). The spacers 724 are formed by forming a silicon oxide film and then performing anisotropic etching. Then, pocket implantation (step S744) and extension implantation (step S746) are performed. For the pocket and extension implantations in the pMOS region, a resist covering the nMOS region is formed and the resist, the gate electrode 714a, 714b, the dummy gate electrode 716, and the dummy electrode 774 are used as a mask to perform implantation for forming a pocket and then ion implantation for forming an extension. The resist is then removed. For the pocket and extension implantations in the nMOS region, on the other hand, a resist covering the pMOS region is formed and the resist, the gate electrode 714a, 714b, the dummy gate electrode 716, and the dummy electrode 774 are used as a mask to perform ion implantation for forming a pocket and then ion implantation for forming an extension. Then the resist is removed. As a result, pockets and extensions are formed around the gate electrode 714a, 714b. It should be noted that the dummy gate electrode 716 is formed on the partial isolation insulator 708, which can prevent implanted ions from penetrating through the partial isolation insulator and into the SOI layer 706 below it.

Figure 38:
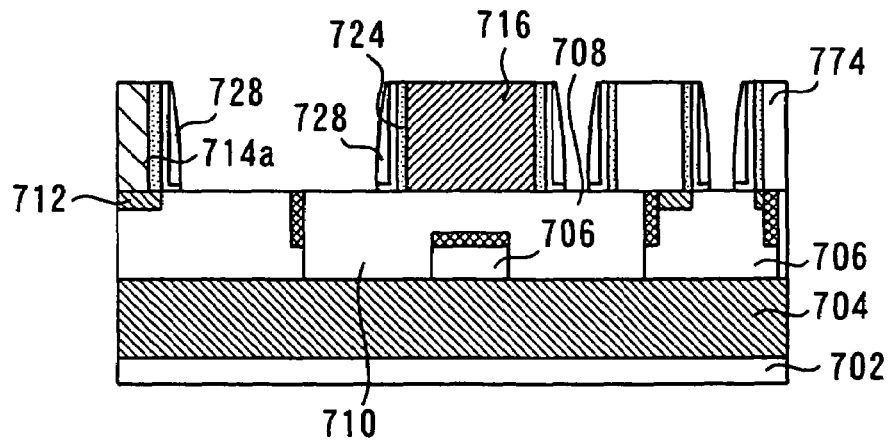

Then, a sidewall 728 is formed on the sides of the gate electrode 714a, 714b, the dummy gate electrode 716, and the dummy electrode 774 as shown in FIG. 38 (step S748). The sidewall 728 is formed by forming a silicon oxide film and a silicon nitride film and performing anisotropic etching.

Then, source/drain implantation is performed (step S750). For forming a source/drain in the pMOS region, a resist covering the nMOS region is formed and the resist, the gate electrode 714a, 714b, the dummy gate electrode 716, and the dummy electrode 774 with the sidewalls 728 are used as a mask to perform ion implantation. For forming a source/drain in the nMOS region, on the other hand, a resist covering the pMOS region is formed and the resist, the gate electrode 714a, 714b, the dummy gate electrode 716, and the dummy electrode 774 with the sidewalls 728 are used as a mask to perform ion implantation. In this way, sources/drains are formed in each nMOS and pMOS region. After unnecessary resists are removed, connections such as wirings are formed in layers as required to complete the semiconductor 700 shown in FIGS. 28A and 28B.

It should be noted that the wiring pattern described with respect to the seventh embodiment does not limit the present invention. Any of other wiring patterns may be used in which a PTI region where a dummy gate electrode 716 can be formed is chosen and the dummy gate electrode 716 is appropriately located in accordance with a wiring layout rule and rule minimum dimensions. Also, any of the configurations of the transistors described with respect to the first to sixth embodiments may be used for the layout of the dummy gate electrodes 716 described with respect to the seventh embodiment.

Figure 39:
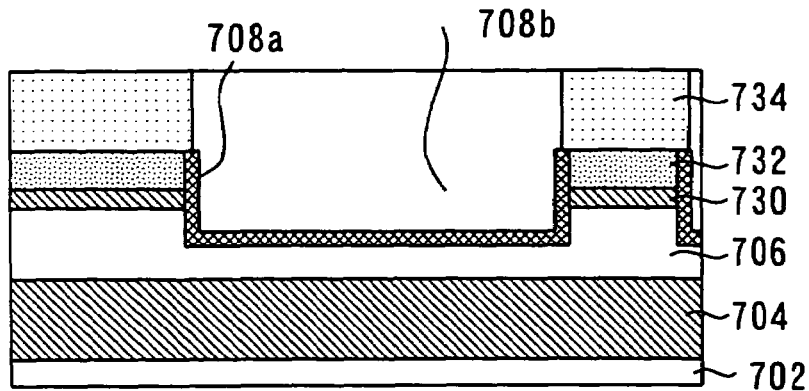
FIG. 39 is schematic cross-sectional view illustrating process step for manufacturing another exemplary semiconductor device according to the seventh embodiment of the present invention.

The SOI layer 706 according to the present invention described above has the complete isolation insulator 710 formed by etching through the SOI layer 706 except the regions for forming the active areas, well potential fixing region 722, and a well. However, the present invention is not limited to structures in which such a complete isolation insulator 710 is formed. For example, a structure may be used in which a thin SOI layer 706 is left under the entire partial isolation insulator 708, as in the first embodiment. To create such a semiconductor device, as shown in FIG. 39, a plasma silicon oxide 708b may be formed (step S722 in FIG. 29) immediately after the oxide film 708a is formed at step S714, without performing steps S716 to S720, and then CMP may be performed (step S724) so that a part of the SOI layer 706 is left under the entire partial isolation insulator 708.

Eighth Embodiment

Figure 40A:
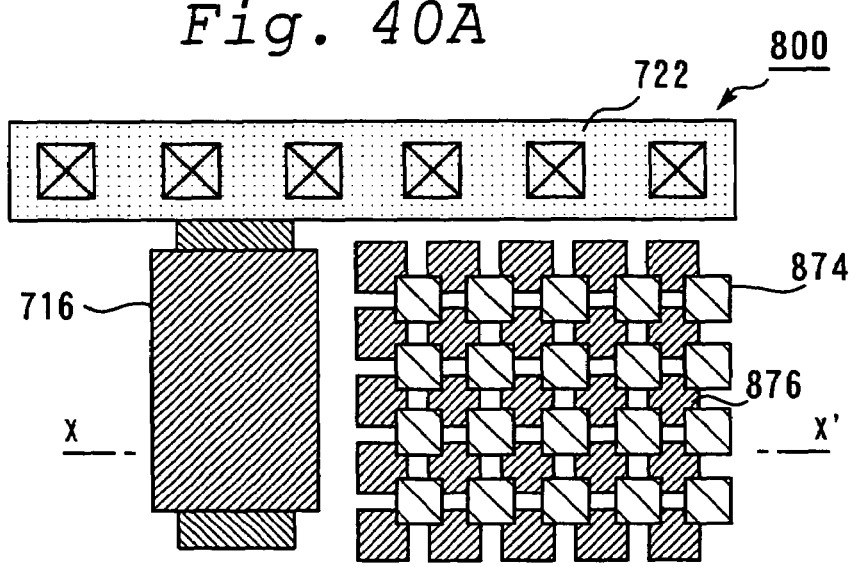
FIGS. 40A and 40B are schematic diagram illustrating a semiconductor device according to an eight embodiment of the present invention.
Figure 40B:
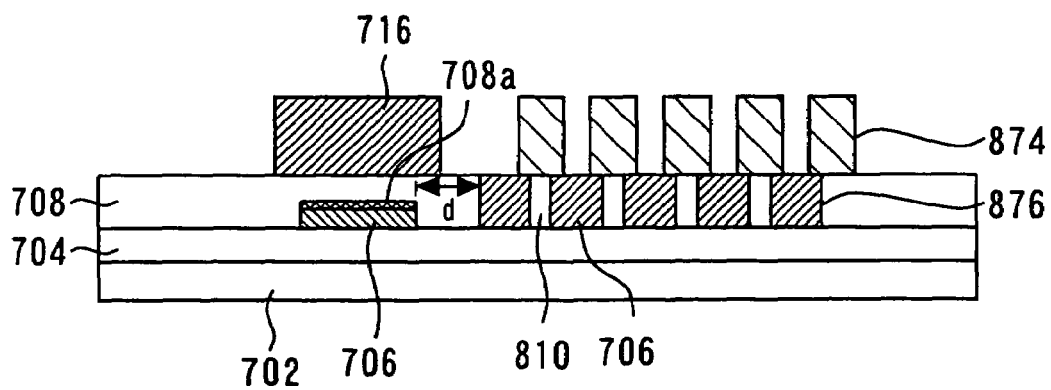

FIGS. 40A and 40B are schematic diagram illustrating a semiconductor device according to an eight embodiment of the present invention. FIG. 40A illustrates the top view of the semiconductor device and FIG. 40B illustrates a cross-sectional view taken on line X-X' of FIG. 40A. FIG. 40A schematically illustrates a portion enclosed in ellipse "a" in FIG. 28A.

The semiconductor device 800 shown in FIGS. 40A and 40B, is the same as the semiconductor device 700 in FIGS. 28A and 28B, except that it has dummy electrodes 874 (fourth gate electrodes) on both sides of a dummy gate electrode 716, in place of the dummy electrodes 774, and further has active dummies 876 (third impurity diffused regions) in the SOI layer 706 under the dummy electrodes 874. Although, in FIGS. 40A and 40B, for simplification, dummy electrodes 874 and active dummies 876 are illustrated only on the right side of the dummy electrode 716, dummy electrodes 874 and active dummies 876 are provided on the left side of dummy electrode 716 in actuality.

In particular, the active dummies 876 are arranged in a dot pattern of SOIs and partial isolation insulators in the SOI layer 706, formed by providing complete isolation insulators 810 in a regular array in the SOI layer 706.

The dummy electrode 874, on the other hand, is arranged in a dot pattern formed on the active dummies 876 in the layer in which the dummy gate electrodes 716 are formed. The active dummies 876 and the dummy electrodes 874 are not completely coincide with each other viewed from above but are staggered in a given direction. That is, one dummy electrode 874 overlaps different active dummies 876 near its four corners. It should be noted that the active dummies 876 are spaced apart from the SOI layer 706 in the PTI regions under the dummy gate electrodes 716 and no active dummy 876 is formed in the PTI regions under the dummy gate electrodes 716.

As has been described above, in the semiconductor device 800 shown in FIGS. 40A and 40B, a dummy electrode 874 and active dummies 876 are provided in spaces on both sides of a dummy gate electrode 716. Thus, a large, flat space is filled with gate electrodes and therefore the flatness in CMP can be ensured. However, if there is sufficient space for forming dummy electrodes 874 and active dummies 876 only on one side of dummy electrode 716, dummy electrodes 874 and active dummies 876 may be formed only in the side.

Ninth Embodiment

Figure 41:
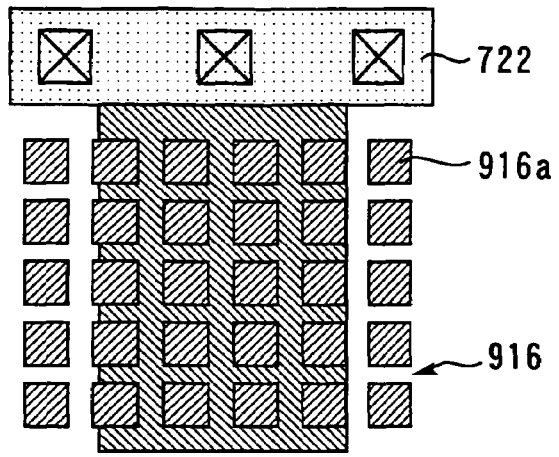
FIG. 41 is a schematic diagram illustrating a semiconductor device according to a ninth embodiment of the present invention.

FIG. 41 is a schematic diagram illustrating a semiconductor device according to a ninth embodiment of the present invention. FIG. 41 illustrates only the dummy electrodes and its vicinity in the semiconductor device 700 in FIG. 28A. The semiconductor device 900 according to the ninth embodiment is the same as the semiconductor device 700 in FIGS. 28A and 28B, except that the dummy gate electrodes have a different structure.

As shown in FIG. 41, dummy gate electrodes 916 are formed at a location equivalent to that of the dummy gate electrodes 716. In particular, in the semiconductor device 900 in FIG. 41, a dummy electrode 916 is formed in a PTI region among the PTI regions between a well potential fixing region 722 and impurity diffused layers 720, where there is sufficient space for forming a dummy gate electrode. That is, in the semiconductor device in which multiple transistors are formed as with the seventh embodiment, a dummy gate electrode 916 is selectively formed only in a space between impurity diffused layers 720 and a well potential fixing region 722 that is large enough for forming the dummy gate electrode.

Each of the dummy gate electrodes 916 is a set of dots 916a, rather than a single large plane pattern. Each of the dots 916a making up the dummy gate electrode 916 is sized and the dots are evenly spaced, in accordance with a layout rule. The space between adjacent dots 916a is filled with sidewalls 928. That is, the space between dots 916a is determined in accordance with a layout rule in such a manner that the space is filled with the sidewall 928 formed.

Figure 42:
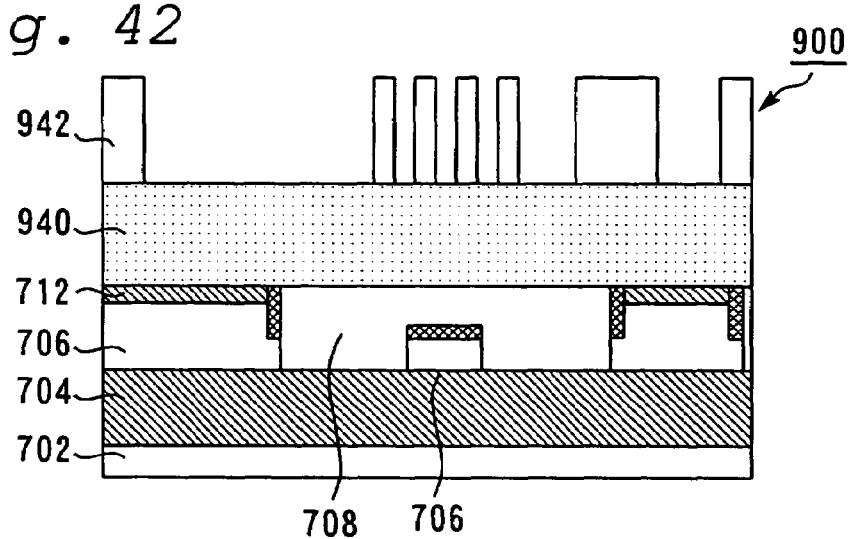
FIGS. 42 to 44 are schematic diagrams illustrating process steps for manufacturing the semiconductor device according to the ninth embodiment of the present invention.
Figure 43:
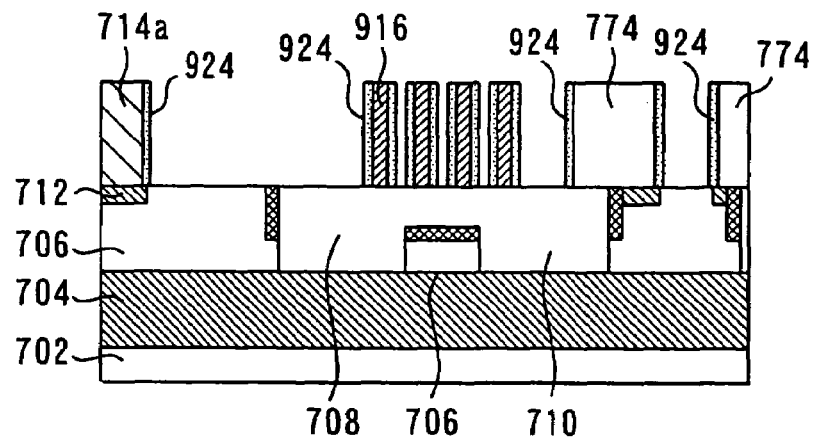
Figure 44:
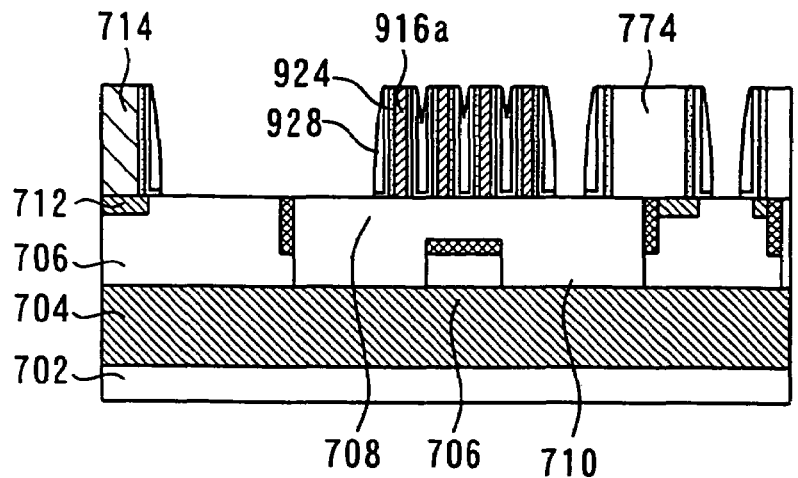

FIGS. 42 to 44 are schematic diagrams illustrating process steps for manufacturing the semiconductor device 900 according to the ninth embodiment of the present invention. FIGS. 42 to 44 show a cross-section of a portion corresponding to the portion enclosed in ellipse "a" in FIG. 28A. The method for manufacturing the semiconductor device 900 according to the ninth embodiment is similar to the process described with respect to the flowchart of FIG. 29.

However, as shown in FIG. 42, the resist pattern 942 formed at step S736 in FIG. 29 for etching a gate polysilicon 940 is a dot resist pattern 942 in which each dot corresponds to the position where each dot 916a of a dummy gate electrode 916 is formed.

Then, the gate polysilicon 940 is etched in the shape of the dots 916a of the dummy gate electrode 916 at step S738 and then the resist pattern 942 is removed. Then, a spacer 924 is formed on the side of each dot 916a and the sides of the gate electrode 714 and the dummy electrode 774, as shown in FIG. 43. Then, after ion implantation is performed, sidewalls 928 are formed on the side of each of the dots 916a and the sides of the gate electrode 714 and the dummy gate electrode 774 as shown in FIG. 44. As a result, the space between the dots 916a is filled with the spacer 924 and sidewall 928.

By forming the dummy gate electrode 916 as a set of dots 916a, the flatness of an insulator in a subsequent CMP process can be improved. In addition, the space between the dots 916a of the dummy gate electrode 916 is designed in such a manner that the space is filled with the spacer 924 and sidewall 928. Therefore, during ion implantation in the source/drain and the well potential fixing region 722, ions can be prevented from penetrating through the partial isolation insulator 708 and into the SOI layer 706 under the partial isolation insulator 708.

The ninth embodiment has been described with respect to the semiconductor device 900 with a structure in which a complete isolation insulator 710 is formed in the SOI layer 706 and a PTI region is provided with a portion of the SOI layer left only in a position where the body and the well potential fixing region 722 are to be interconnected. However, the present invention is not so limited but a structure in which the complete isolation insulator 710 is not formed may be used.

The shape of the dummy gate electrode 916 according to the ninth embodiment can be applied to the eighth embodiment. That is, the dummy gate electrode 716 in the semiconductor device 800 of the eighth embodiment may be formed in a pattern like the pattern of dots 916a according to the ninth embodiment. In that case, the dimensions and pitch of the dots 916a of the dummy gate electrode 916 may be different from the dimensions and pitch of the dot pattern of the active dummy 876 and dummy electrode 874.

The number of arrays of dots 916a and the shape of each dot 916a shown in FIG. 41 do not limit the present invention. Furthermore, the pattern of dots 916a is not limited to a pattern in which dots 916a are evenly arranged in the region where the dummy gate electrode 916 is formed.

Tenth Embodiment

Figure 45:
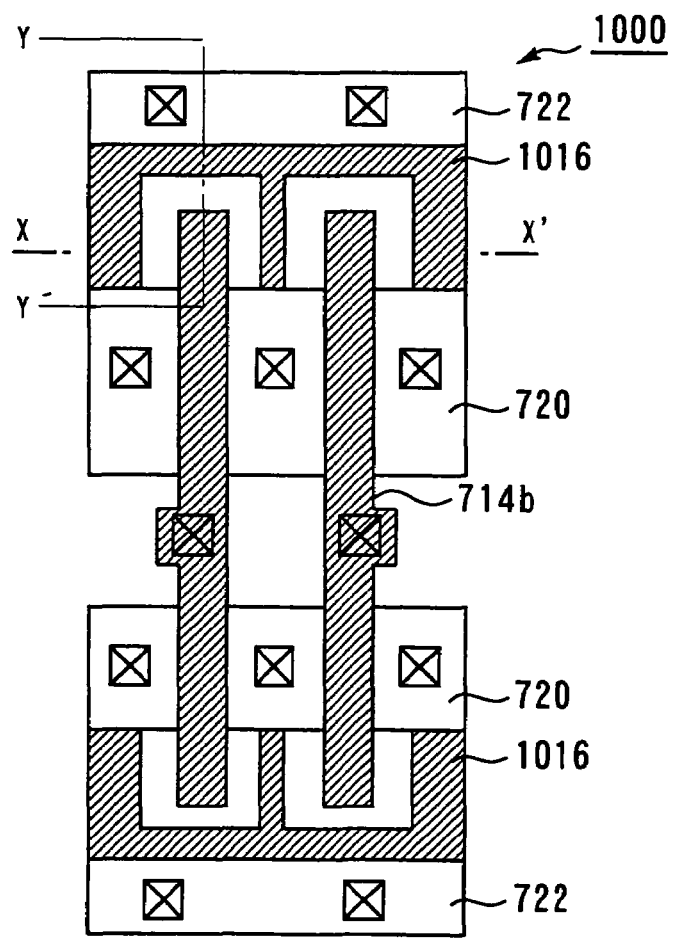
FIGS. 45 to 47 are schematic diagrams illustrating a semiconductor device according to a tenth embodiment of the present invention.
Figure 46:
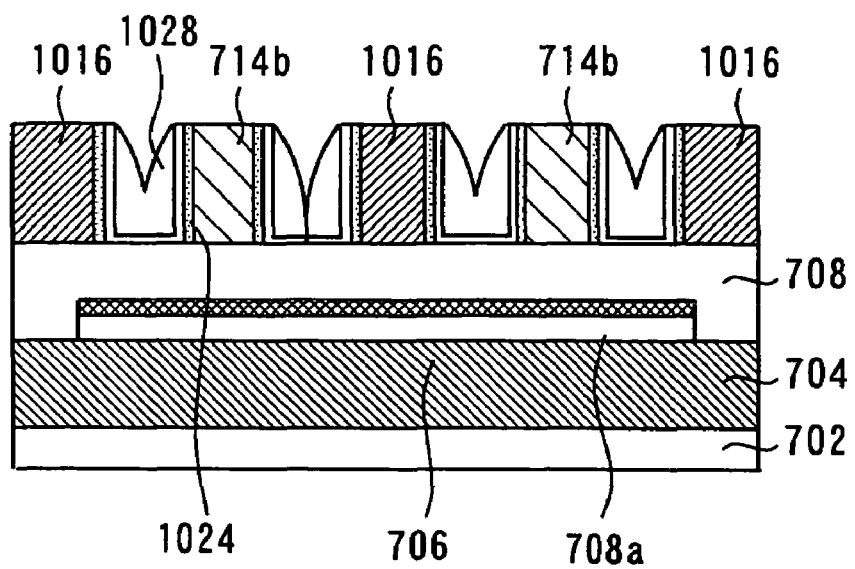
Figure 47:
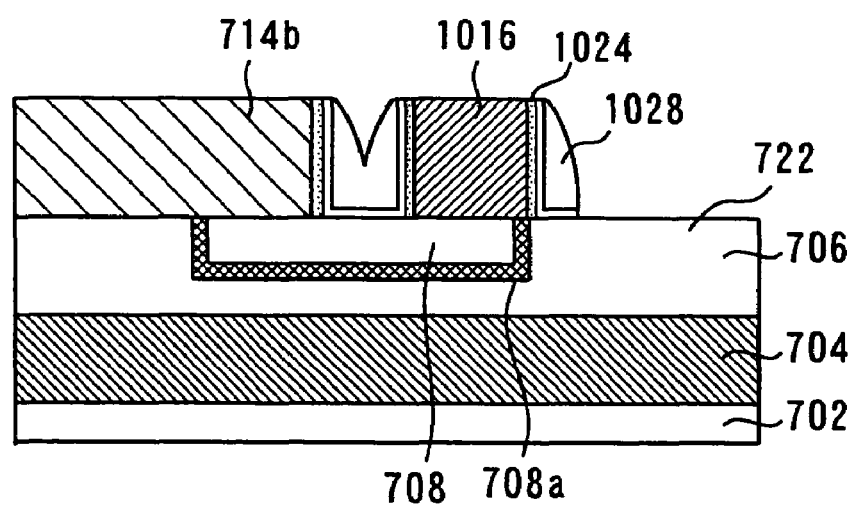

FIGS. 45 to 47 are schematic diagrams illustrating a semiconductor device according to a tenth embodiment of the present invention. FIG. 45 illustrates a top view of the semiconductor device, FIG. 46 illustrates a cross-section taken on line X-X' of FIG. 45, and FIG. 47 illustrates a cross-section taken on line Y-Y' of FIG. 45. The semiconductor device 1000 shown in FIGS. 45 to 47 is the same as the semiconductor device 700 shown in FIGS. 28A and 28B, except the pattern of dummy gate electrodes 1016. FIGS. 45 to 47 show a layout in which a dummy gate electrode is formed between a gate electrode 714b and a well potential fixing region 722, as shown in the left-hand part of FIGS. 28A and 28B.

In particular, the dummy gate electrode 1016 surround each end of the gate electrode 714b as shown in FIGS. 45 to 47. The space between the dummy gate electrode 1016 and the gate electrode is filled with a spacer 1024 and a sidewall 1028. Referring to FIG. 47, the dummy gate electrode 1016 partially overlaps the well potential fixing region 722. On the other hand, the edges of the dummy gate electrode 1016 does not overlap the impurity diffused layers 720b. This prevents occurrence of a leak current.

The dummy electrode 1016 thus arranged is provided in place of the dummy gate electrode 716 in FIGS. 28A and 28B. However, the present invention is not so limited. A dummy electrode 1016 of this shape can be provided in such a manner that it surrounds the ends of all or some of the gate electrodes 714 in the remaining part of the semiconductor device.

While the space between the dummy gate electrode 1016 and the gate electrode 714b is filled with a sidewall 1028 in the example described with respect to FIGS. 45 to 47, the present invention is not so limited. Depending on layout rules and the like, the space between a dummy gate electrode 1016 and a gate electrode 714b cannot be filled with a sidewall 1028 alone. FIGS. 48A to 51B are schematic diagrams illustrating an example of the case. each of FIGS. 48A, 49A, 50A and 51A illustrates a portion corresponding to the X-X' cross-section in FIG. 45 and each of FIGS. 48B, 49B, 50B and 51B illustrates a portion corresponding to the Y-Y' cross-section.

If the space between a dummy gate electrode 1016 and a gate electrode 714b is too large to be filled with a sidewall 1028 alone, an additional, oxide sidewall 1030 is formed to fill the space between the gate electrode 714b and the dummy gate electrode 1016.

Figure 48A:
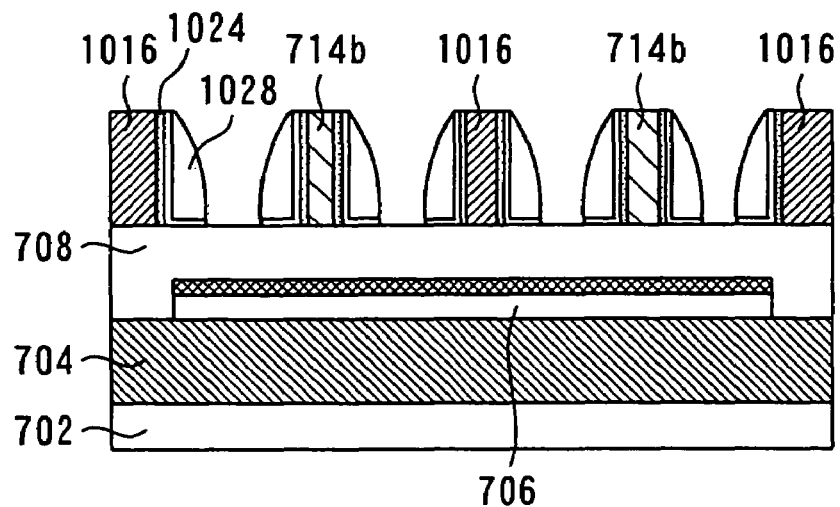
FIGS. 48A to 51B are schematic diagrams illustrating process steps for manufacturing another exemplary semiconductor device according to a tenth embodiment of the present invention.
Figure 48B:
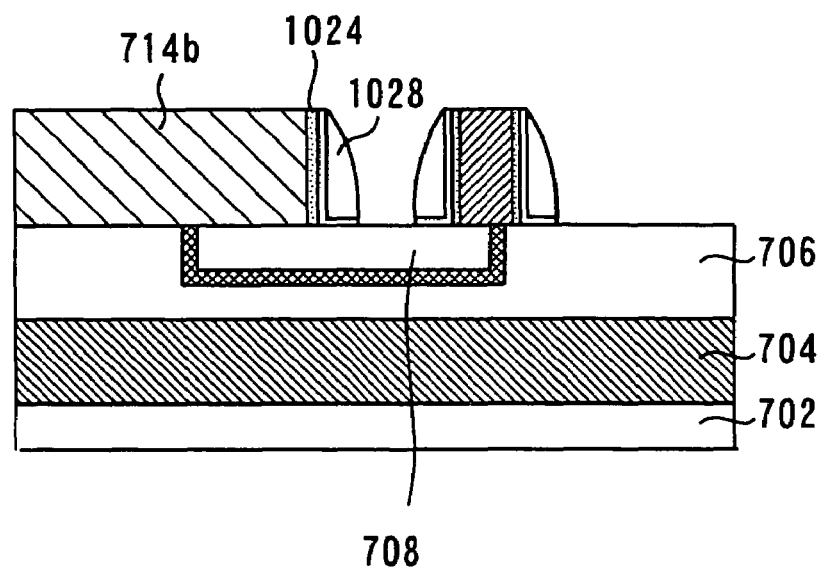
Figure 49A:
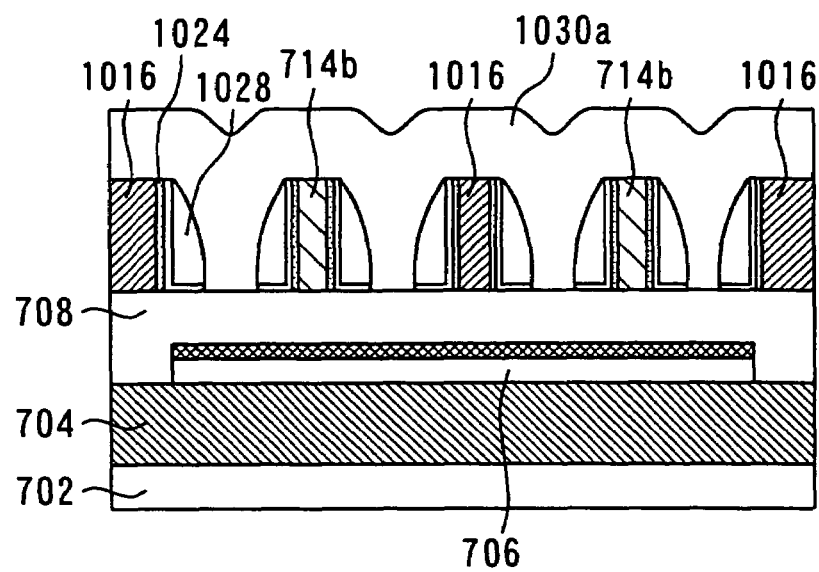
Figure 49B:
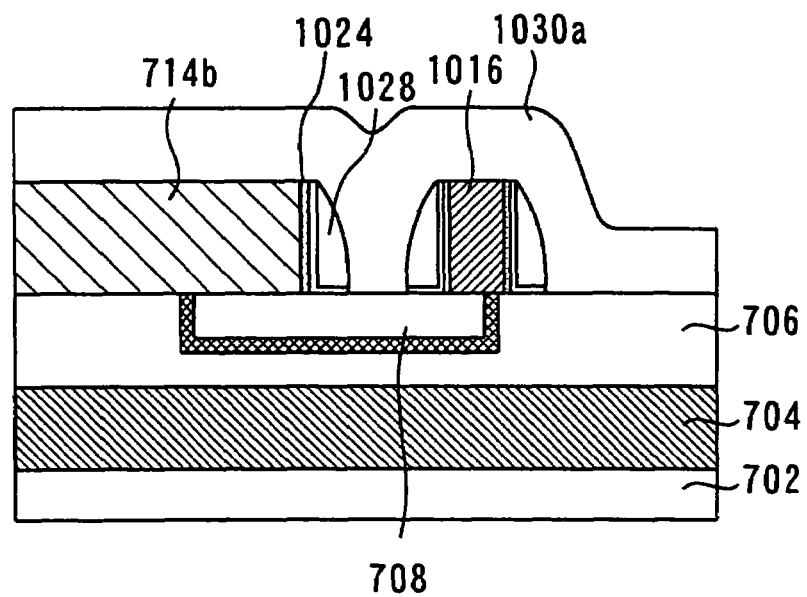
Figure 50A:
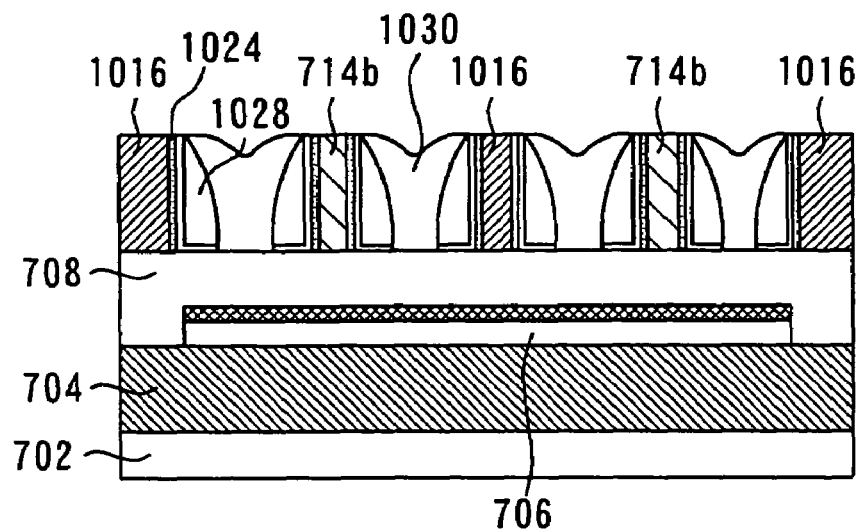
Figure 50B:
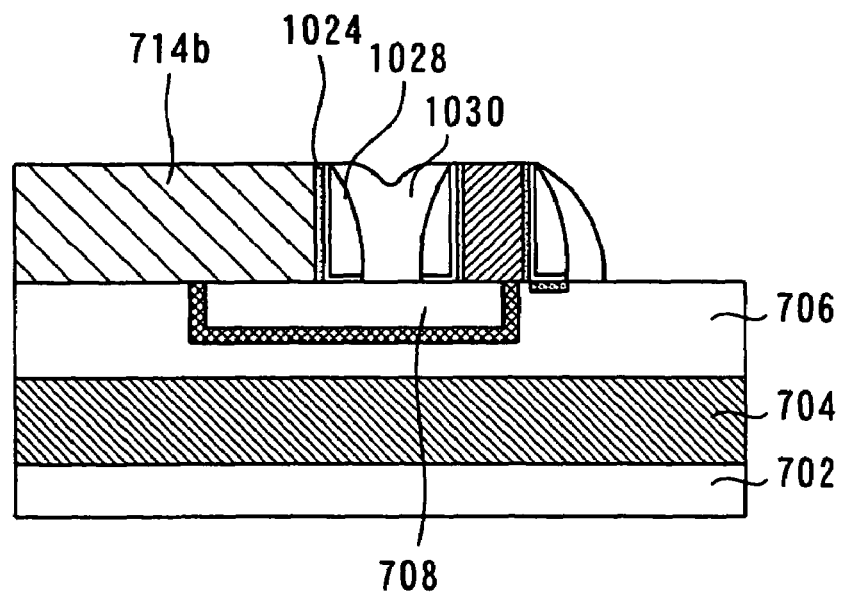
Figure 51A:
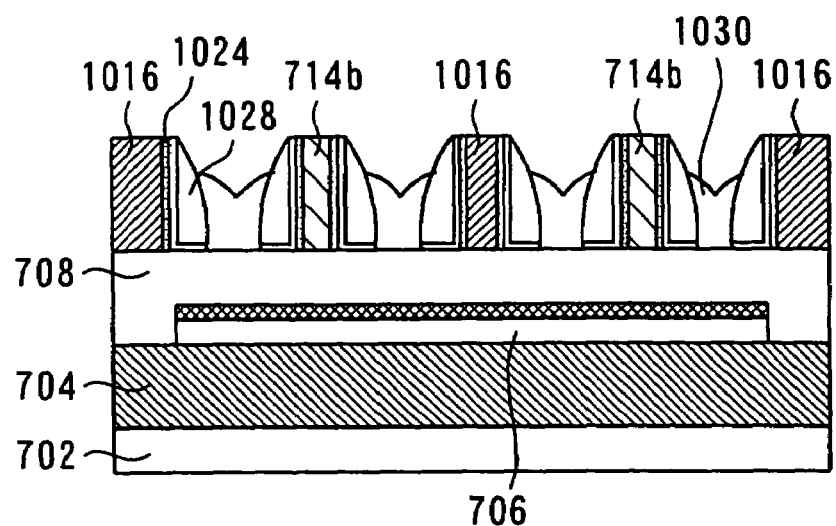
Figure 51B:
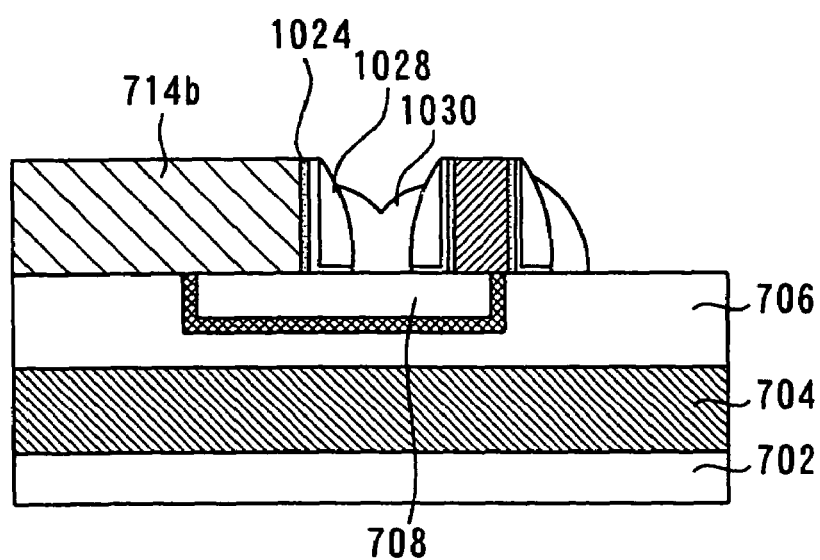

In particular, after sidewalls are formed in step S748 as shown in FIGS. 48A and 48B, a plasma silicon oxide film 1030a is formed over them as shown in FIGS. 49A and 49B. The thickness of the plasma silicon oxide film 1030a is chosen to be at least half the distance between sidewalls 1028. Then, etch-back is performed by using anisotropic dry etching to form oxide sidewalls 1030 (third insulator) as shown in FIGS. 50A and 50B. Isotropic etching is then performed to remove unnecessary silicon oxide film 1030a, as shown in FIGS. 51A and 51B. Here, the etching is performed by setting conditions such that the silicon oxide film 1030a on the impurity diffused layers 720a, 720b and on the well potential fixing region 722 is removed and the oxide sidewall 1030 between the dummy gate electrode 1016 and the gate electrode 714 is left. As a result, the space between the gate electrode and the dummy gate electrode is filled with the oxide sidewall.

It should be noted that the method of filling the space with an oxide sidewall 1030 after a sidewall is formed can be applied to any of the first to ninth embodiments if, for example, the space between dot patterns 916a constituting a dummy gate electrode 916 cannot be filled with a single sidewall alone in the ninth embodiment.

The features and the advantages of the present invention as described above may be summarized as follows.

According to one aspect of the present invention, in the semiconductor device, on a first isolator between a first gate electrode and a second impurity diffused region, a second gate electrode is formed. The second gate is used as a mask during ion implantation for forming a first impurity diffused region. This can prevent ions from penetrating through the first insulator and into a semiconductor layer under the first isolator. Consequently, degradation of isolation characteristics can be inhibited and the yields of production of semiconductor devices can be increased.

Obviously many modifications and variations of the present invention are possible in the light of the above teachings. It is therefore to be understood that within the scope of the appended claims the invention may by practiced otherwise than as specifically described.

The entire disclosures of a Japanese Patent Application No. 2005-35985, filed on Feb. 14, 2005 and No. 2005-372223, filed on Dec. 26, 2005 including specifications, claims, drawings and summaries, on which the Convention priorities of the present application are based, are incorporated herein by references in its entirety.

The invention claimed is:

1. A semiconductor device comprising:
   a substrate including an underlying silicon substrate, a buried insulator, and a semiconductor layer;
   a first gate electrode formed on a gate insulator on the semiconductor layer;
   a first impurity diffused region formed in a region around the first gate electrode in the direction of the length of the first gate electrode in the semiconductor layer by implanting with an impurity of a first conductivity type;
   a second impurity diffused region formed in a region in the semiconductor layer in the direction of an extension line of the length of the first gate electrode by implanting with an impurity of a second conductivity type opposite the first conductivity type;
   a first insulator which is formed at least on a region of the semiconductor layer between the second impurity diffused region and the first gate electrode; and
   a second gate electrode formed on the first insulator between the second impurity diffused region and the first gate electrode,
   wherein the first insulator has a complete isolation region on both sides of the width of the first gate electrode at an end of the first gate electrode opposed to the second gate electrode, the complete isolation region penetrating through the semiconductor layer down to the buried insulator.

2. A semiconductor device comprising:
   a substrate including an underlying silicon substrate, a buried insulator, and a semiconductor layer;
   a first gate electrode formed on a gate insulator on the semiconductor layer;
   a first impurity diffused region formed in a region around the first gate electrode in the direction of the length of the first gate electrode in the semiconductor layer by implanting with an impurity of a first conductivity type;
   a second impurity diffused region formed in a region in the semiconductor layer in the direction of an extension line of the length of the first gate electrode by implanting with an impurity of a second conductivity type opposite the first conductivity type;
   a first insulator which is formed at least on a region of the semiconductor layer between the second impurity diffused region and the first gate electrode; and
   a second gate electrode formed on the first insulator between the second impurity diffused region and the first gate electrode,
   wherein the first insulator is also formed in a region surrounding the first impurity diffused region, and the semiconductor device further comprises a third gate electrode formed on the first insulator in such a manner that the third gate electrode surrounds the first impurity diffused region.

3. The semiconductor device according to claim 2, wherein the third gate electrode consists of a plurality of segments of electrode surrounding the first impurity diffused region.

4. A semiconductor device comprising:
   a substrate including an underlying silicon substrate, a buried insulator, and a semiconductor layer;
   a first gate electrode formed on a gate insulator on the semiconductor layer;
   a first impurity diffused region formed in a region around the first gate electrode in the direction of the length of the first gate electrode in the semiconductor layer by implanting with an impurity of a first conductivity type;
   a second impurity diffused region formed in a region in the semiconductor layer in the direction of an extension line of the length of the first gate electrode by implanting with an impurity of a second conductivity type opposite the first conductivity type;
   a first insulator which is formed at least on a region of the semiconductor layer between the second impurity diffused region and the first gate electrode; and
   a second gate electrode formed on the first insulator between the second impurity diffused region and the first gate electrode,
   wherein the second gate electrode is divided into a plurality of segments which are arranged at predetermined intervals.

5. The semiconductor device according to claim 4, wherein the space between the segments of the second gate electrode arranged at the predetermined intervals is filled with a sidewall.

6. The semiconductor device according to claim 5, wherein the space between the second gate electrode and the first gate electrode is further filled with a third insulator.

7. A semiconductor device comprising:
   a substrate including an underlying silicon substrate, a buried insulator, and a semiconductor layer;
   a first gate electrode formed on a gate insulator on the semiconductor layer;
   a first impurity diffused region formed in a region around the first gate electrode in the direction of the length of the first gate electrode in the semiconductor layer by implanting with an impurity of a first conductivity type;
   a second impurity diffused region formed in a region in the semiconductor layer in the direction of an extension line of the length of the first gate electrode by implanting with an impurity of a second conductivity type opposite the first conductivity type;
   a first insulator which is formed at least on a region of the semiconductor layer between the second impurity diffused region and the first gate electrode; and
   a second gate electrode formed on the first insulator between the second impurity diffused region and the first gate electrode,
   a plurality of third impurity diffused regions formed in the semiconductor layer on a side of the second gate electrode at predetermined pitches and at predetermined intervals; and
   third gate electrodes formed on the plurality of third impurity diffused regions at predetermined intervals.

8. A method for manufacturing a semiconductor device, comprising the steps of:
   forming a first insulator which separates a semiconductor layer of a silicon-on-insulator substrate including an underlying substrate, a buried insulator formed on top of the underlying substrate and a semiconductor layer formed on top of the buried insulator, into first and second regions;
   forming a gate insulator on the semiconductor layer;
   forming a first gate electrode on the first region and a second gate electrode on the first insulator;
   forming a first resist mask covering the second region;
   implanting an impurity of a first conductivity type into the first region by using the first resist mask and the first and second gate electrodes as a mask;

removing the first resist mask;
forming a second resist mask covering the first region;
implanting a second impurity of a second conductivity type into the semiconductor layer by using the second resist mask; and
removing the second resist mask.

9. The method for manufacturing a semiconductor device according to claim 8, wherein the first resist mask is formed in such a manner that the first resist mask covers at least a portion of the second gate electrode.

10. The method for manufacturing a semiconductor device according to claim 8, wherein the second resist mask is formed in such a manner that the second resist mask covers at least a portion of the first gate electrode.

* * * * *